US008624328B2

(12) United States Patent
Kawahara et al.

(10) Patent No.: US 8,624,328 B2
(45) Date of Patent: Jan. 7, 2014

(54) SEMICONDUCTOR DEVICE

(75) Inventors: Jun Kawahara, Kanagawa (JP);
Yoshihiro Hayashi, Kanagawa (JP);
Ippei Kume, Kanagawa (JP)

(73) Assignee: Renesas Electronics Corporation, Kawasaki-shi, Kanagawa (JP)

( * ) Notice: Subject to any disclaimer, the term of this patent is extended or adjusted under 35 U.S.C. 154(b) by 610 days.

(21) Appl. No.: 12/591,089

(22) Filed: Nov. 6, 2009

(65) Prior Publication Data

US 2010/0123199 A1 May 20, 2010

(30) Foreign Application Priority Data

Nov. 19, 2008 (JP) ................................. 2008-296042
Aug. 6, 2009 (JP) ................................. 2009-183503

(51) Int. Cl.
*H01L 27/06* (2006.01)
(52) U.S. Cl.
USPC .................................. 257/379; 257/E27.016
(58) Field of Classification Search
USPC ......... 257/379, 534, 200, 296, 532, 306, 309; 438/238, 257, 240
See application file for complete search history.

(56) References Cited

U.S. PATENT DOCUMENTS

| | | | | |
|---|---|---|---|---|
| 6,320,244 B1 * | 11/2001 | Alers et al. | .................... | 257/534 |
| 6,441,419 B1 * | 8/2002 | Johnson et al. | ............... | 257/296 |
| 2003/0228733 A1 * | 12/2003 | Itoh et al. | ...................... | 438/240 |
| 2005/0006665 A1 * | 1/2005 | Ohnishi et al. | ................ | 257/200 |
| 2007/0173012 A1 * | 7/2007 | Aoki | ............................. | 438/238 |
| 2007/0253144 A1 * | 11/2007 | Kuwajima | .................... | 361/311 |
| 2008/0076216 A1 * | 3/2008 | Pae et al. | ....................... | 438/257 |

FOREIGN PATENT DOCUMENTS

| | | |
|---|---|---|
| JP | 2000-3960 | 1/2000 |
| JP | 2004-342787 | 12/2004 |
| JP | 2005-101647 | 4/2005 |
| JP | 2007-201101 | 8/2007 |

OTHER PUBLICATIONS

M. Ueki, et al., "Cost-effective and High Performance Cu Interconnects (keff=2.75) with Continuous SiOCH Stack Incorporating a Low-k Barrier Cap (k=3.1)", IEEE IEDM, pp. 973-976 (2007).

* cited by examiner

*Primary Examiner* — Jarrett Stark
*Assistant Examiner* — Lawrence Tynes, Jr.
(74) *Attorney, Agent, or Firm* — McGinn Intellectual Property Law Group, PLLC

(57) ABSTRACT

Provided is a semiconductor device including: a semiconductor substrate; a multi-layered wiring structure which is formed over the semiconductor substrate and in which a plurality of wiring layers, each of which is formed by a wiring and an insulating layer, are laminated; and a capacitive element having a lower electrode, a capacitor insulating layer, and an upper electrode which is embedded in the multi-layered wiring structure, wherein at least two or more of the wiring layers are provided between a lower capacitor wiring connected to the lower electrode and an upper capacitor wiring connected to the upper electrode.

24 Claims, 31 Drawing Sheets

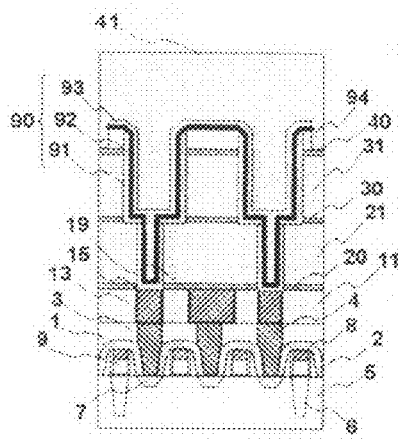 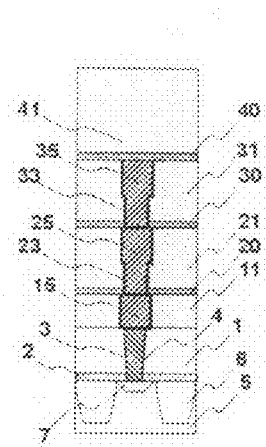
FIG. 25A    FIG. 25B
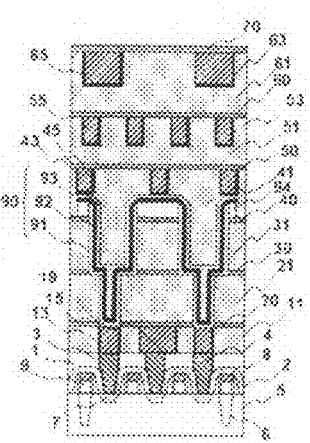 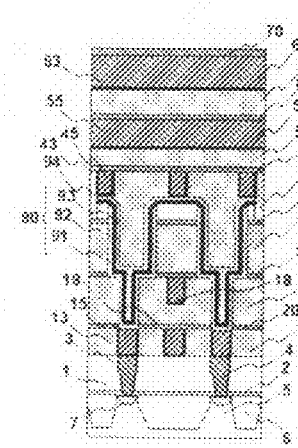 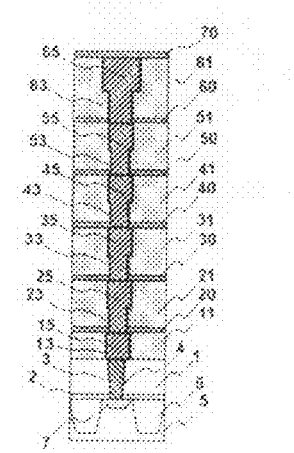
FIG. 26A    FIG. 26B    FIG. 26C

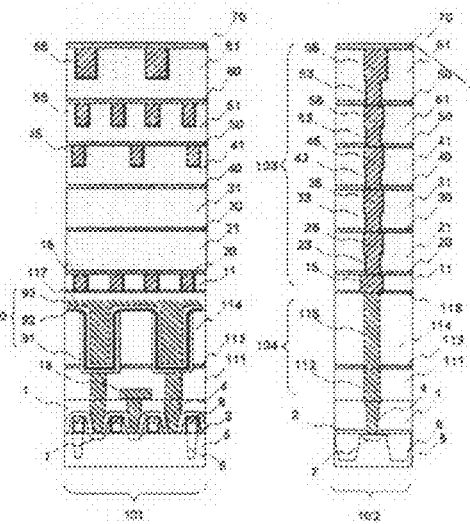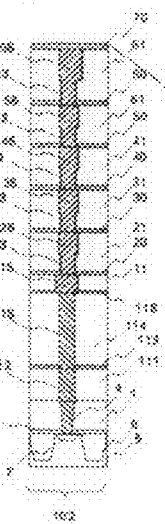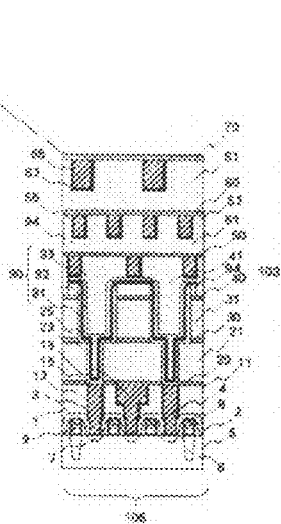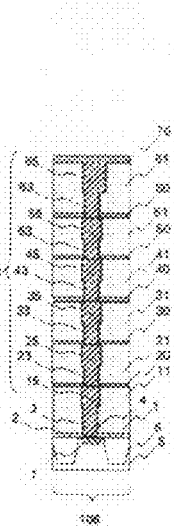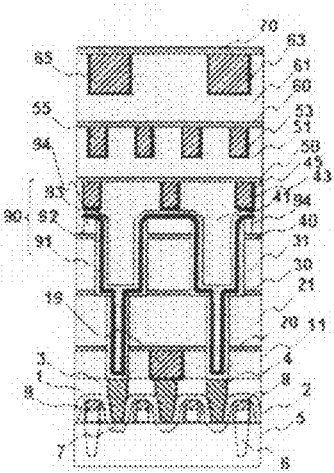

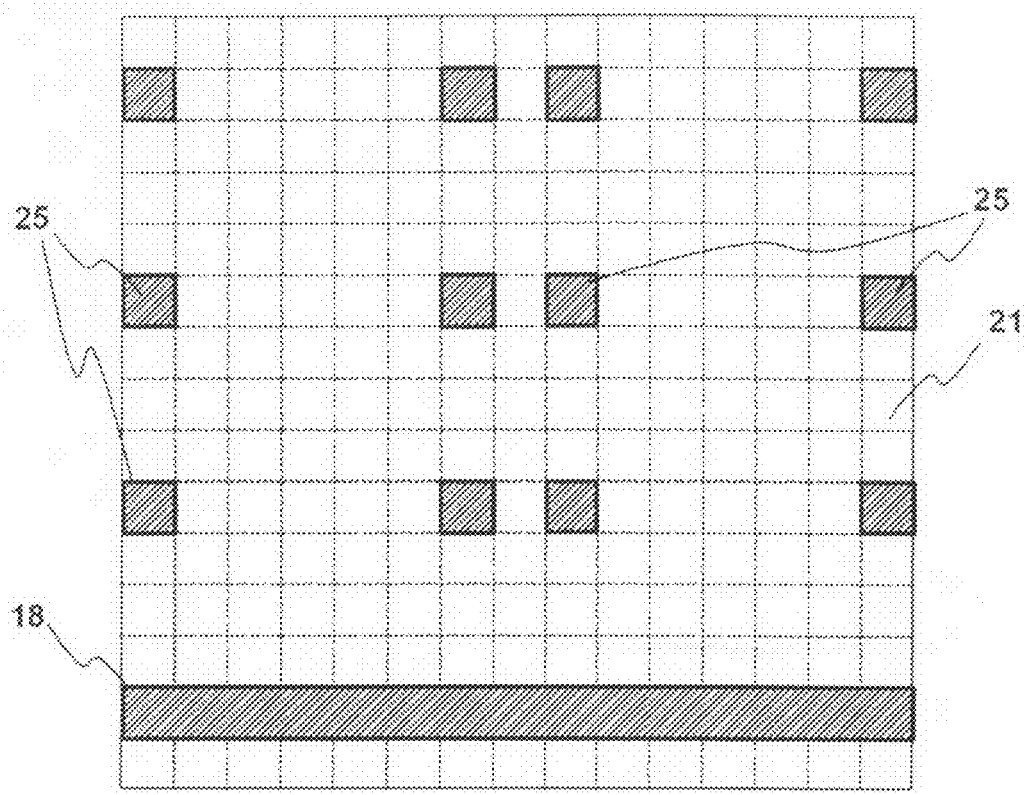

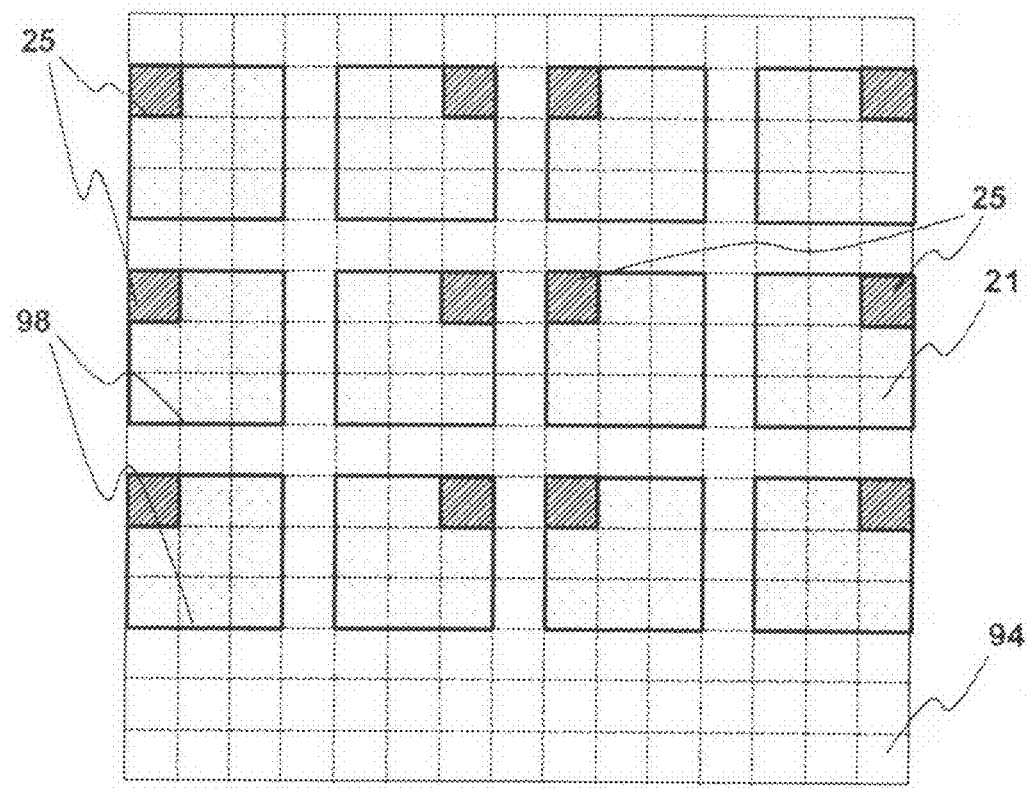

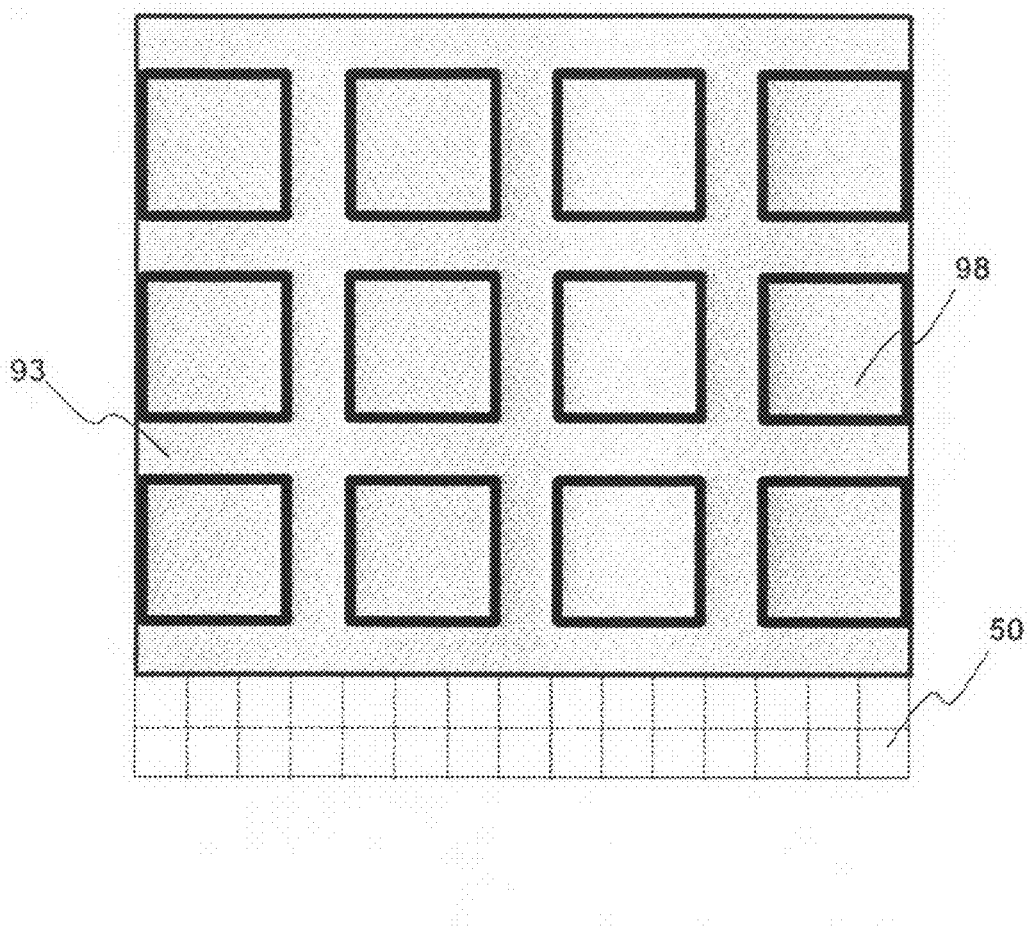

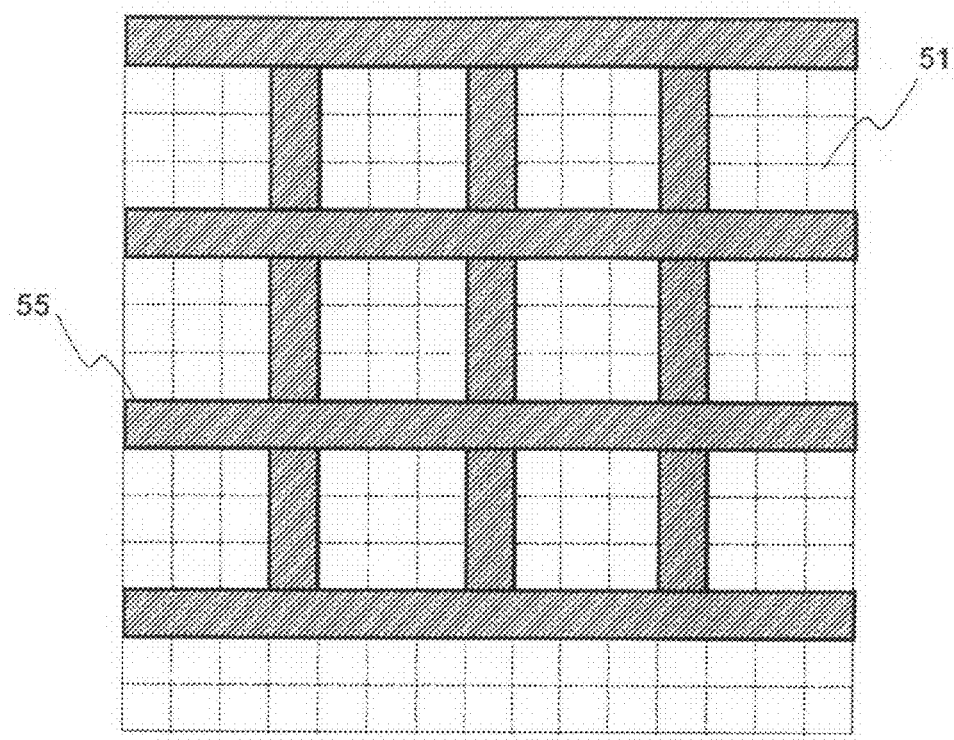

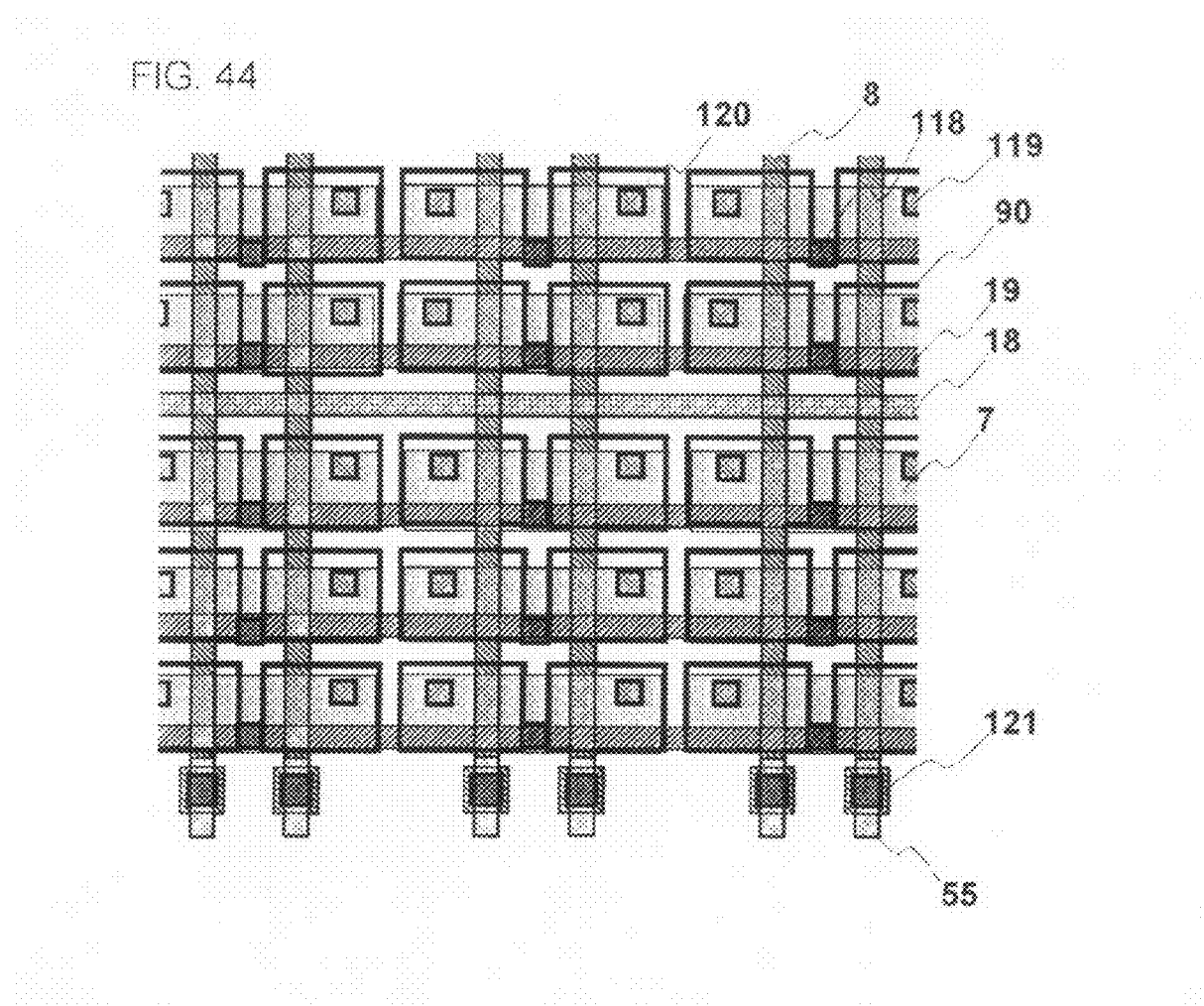

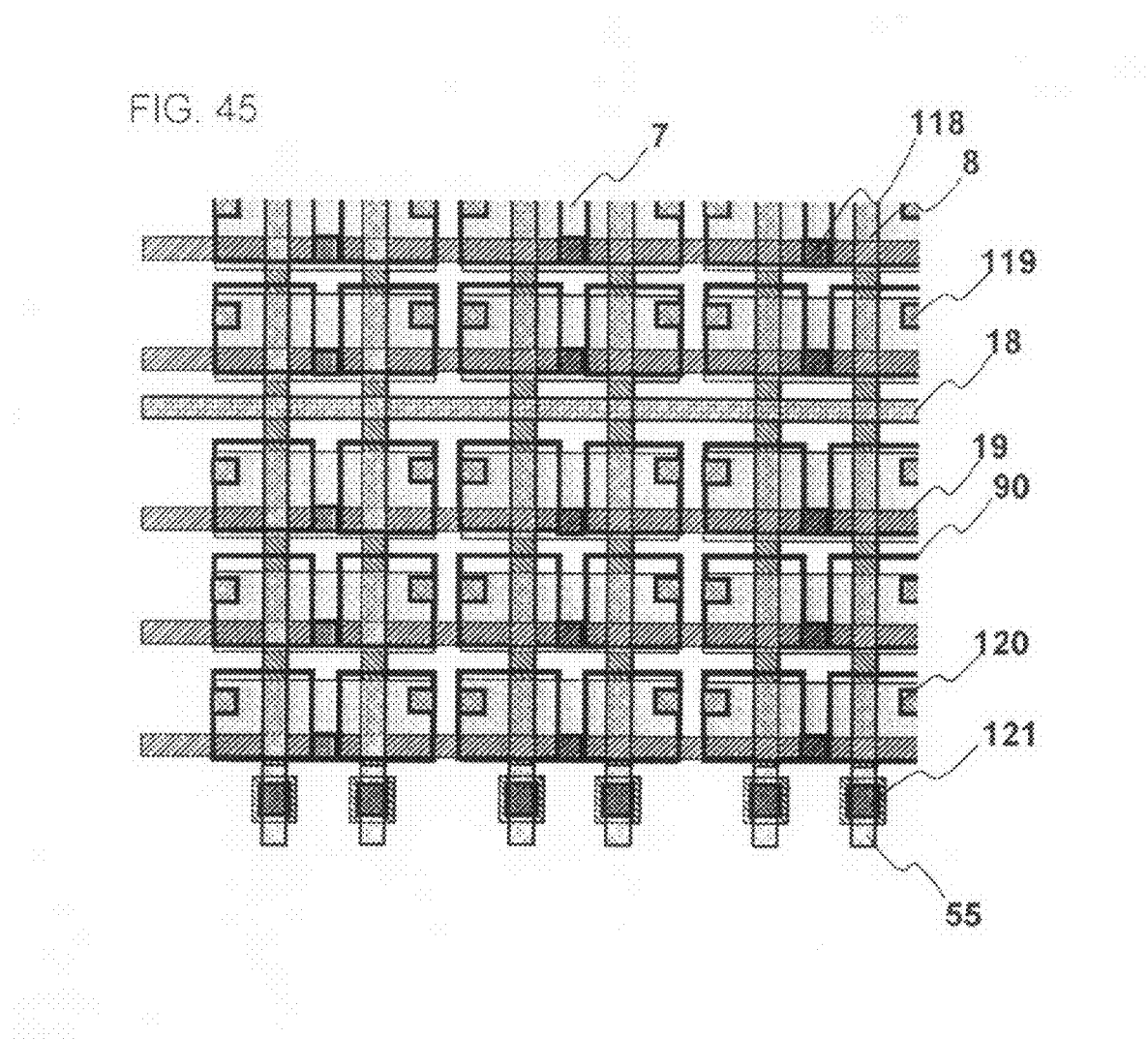

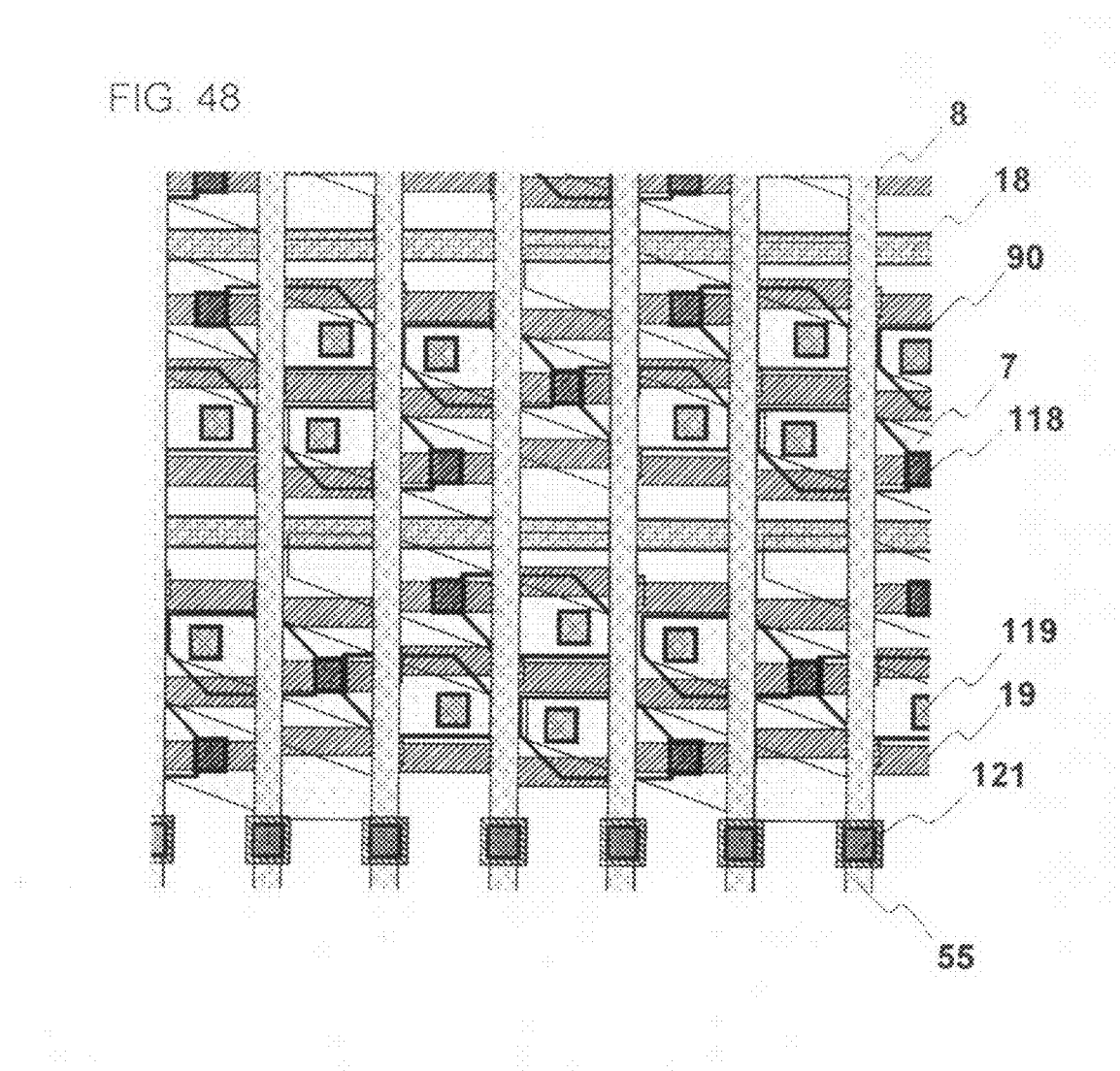

SEMICONDUCTOR DEVICE

This application is based on Japanese patent application NO. 2008-296042 and Japanese patent application NO. 2009-185303, the content of which are incorporated hereinto by reference.

BACKGROUND

1. Technical Field

The present invention relates to a semiconductor device.

2. Related Art

There are growing demands for higher integration and speed in the manufacturing technology of the integrated circuit field in the electronic industry. In addition, as the circuit size increases according to the improvement in integration, the degree of difficulty in design is also increasing.

An integrated circuit in which a logic circuit and a memory circuit are mounted over the same semiconductor substrate, what is called a composite circuit, has a feature in that the logic circuit and the memory circuit exist over the same substrate. Accordingly, not only the integration efficiency is improved simply because the layout within the short distance is possible, but also the operation speed is increased because a wiring between circuits is short.

However, when a logic circuit and a memory circuit having a capacitive element are mounted over the same semiconductor substrate, it is usually necessary to use a structure, which is not used when the logic circuit is formed, in order to form a capacitive element which is provided in the memory circuit and is used to store the data. For example, in the case of a trench type capacitive element, a technique of forming a deep groove with a depth of several microns or more in a semiconductor substrate and forming a capacitive element in the groove has been reported. However, not only the trench opening size decreases with miniaturization of elements, but also the depth steadily increases in order to ensure the capacitance. As a result, the degree of difficulty in the manufacturing process is increasing extremely.

On the other hand, also in the case of a stacked capacitive element, a fin type or a cylinder type is adopted for the stacked structure in order to realize the desired capacitance. In a so-called COB structure (capacitor over bit line structure) in which a capacitive element is formed over a bit line, it is necessary to increase the height of the capacitor in order to ensure the capacitance of the capacitive element.

Currently, there are various kinds of proposals regarding a semiconductor device in which a wiring layer provided between a lower capacitor wiring and an upper capacitor wiring of a capacitive element is a single layer (for example, see Japanese Unexamined Patent Publication NOS. 2000-003960 and 2005-101647).

Ensuring the height of a capacitive element by using a stacked structure increases the distance between a wiring of a lower capacitor portion and a wiring of an upper capacitor portion.

Accordingly, since the contact height from a first wiring layer to a diffusion layer increases in a logic circuit portion, the level of difficulty is increased in the manufacturing process.

In addition, since the electric resistance of a layer in which the capacitive element is formed increases, that is, since the parasitic resistance also increases, the operation speed is decreased in terms of performance.

Moreover, when designing a logic circuit in the case where a memory circuit and a logic circuit are formed over the same semiconductor substrate as described above, it is necessary to perform the design in which the parasitic resistance and the like are considered, in consideration of the forming of a capacitive element. This means that in the cases where the same logic circuit is designed, a design parameter needs to be changed according to whether or not a capacitive element exists over the same semiconductor substrate, especially according to the difference of wiring resistance or its parasitic capacitance. Accordingly, in spite of the circuits being completely the same, the design work should be performed again only because a logic circuit is formed simultaneously with a capacitive element. In some cases, the operation speed of a circuit may drop or the operation margin may be reduced due to being provided together with a capacitive element and as a result, the circuit may not operate in the end.

As an example of the proposal for reducing the contact height of a logic circuit portion, Japanese Unexamined Patent Publication NO. 2007-201101 may be mentioned first. Japanese Unexamined Patent Publication NO. 2007-201101 discloses that neither a dedicated process nor a dedicated facility for forming a wiring, which is called a plate line for connection between upper electrodes, is needed by connecting upper electrodes of capacitive elements to each other with an upper capacitor wiring formed at the same height as a wiring existing in a logic circuit portion and that the thicknesses of upper and lower layers of the capacitive element can be ensured and the aspect of a contact (logic contact) of the logic circuit portion can be reduced.

Regarding the proposal disclosed in Japanese Unexamined Patent Publication NO. 2007-201101, the contact height may be reduced, but a reduction in the contact height of the logic circuit portion is equivalent to one layer of the wiring height, which is restrictive. In order to increase the capacitance of a capacitive element in this structure, it is necessary to increase the height of the capacitive element. In this case, however, the logic contact height also increases with an increase in capacitance height. As a result, not only the level of difficulty in contact manufacture increases, but also the resistance of the logic contact increases. Moreover, although a copper wiring material containing copper as a main component is preferable as a multi-layered wiring material of the logic circuit portion, a wiring other than the copper wiring material, that is, a tungsten (W) wiring with high resistance is used. In addition, the structure of a wiring layer in which a capacitive element exists is different from the wiring structure of a normal logic circuit due to the existence of the capacitive element. That is, in the layer in which a capacitive element exists, the logic contact height is large and the resistance is also high. As a result, there are needed dedicated design parameters which are not compatible with parameters for design of a normal logic circuit in which all wiring layers are formed of a low-resistance copper material.

In the proposal disclosed in Japanese Unexamined Patent Publication NO. 2004-342787, a first layer wiring is formed in an intermediate portion of a capacitive element in order to reduce the contact height. In this case, the contact height of a logic circuit portion may be reduced similar to Japanese Unexamined Patent Publication NO. 2007-201101. However, even if the method disclosed in Japanese Unexamined Patent Publication NO. 2004-342787 is used, the structure of the logic circuit portion becomes a different structure from the structure in which a capacitive element is not provided because the structure of the logic circuit portion depends on the structure of a capacitive element.

Accordingly, even if the structure disclosed in Japanese Unexamined Patent Publication NO. 2004-342787 is used, it is necessary to use dedicated values as the design parameters of a logic circuit when the logic circuit is provided together with a memory circuit. Moreover, also in the method disclosed in Japanese Unexamined Patent Publication NO. 2004-342787, it is necessary to form a high capacitor by increasing the thickness of an interlayer insulating layer in order to ensure the capacitance of the capacitive element, similar to the method disclosed in Japanese Unexamined Patent Publication NO. 2007-201101. In addition, since not all wirings at the memory circuit side are copper wirings, all multi-layered wirings at the logic circuit side cannot be copper wirings. Also in this case, the level of difficulty when forming a contact increases or the contact resistance increases, similar to Japanese Unexamined Patent Publication NO. 2007-201101. Moreover, in a multi-layered wiring of the latest logic circuit, a low dielectric constant interlayer insulating layer, such as an SiOCH layer, is introduced for at least narrow-pitch local wirings located in a lower layer. Since the low dielectric constant interlayer insulating layer (Low-k layer) has a limitation in thermal resistance, it is not possible to apply a W wiring using CVD-W with high growing temperature, for example. For this reason, Low-k/Cu wirings cannot be formed in all layers of the multi-layered wiring at the logic circuit side. As a result, there are needed dedicated design parameters which are not compatible with parameters for design of a normal logic circuit in which all wiring layers are formed in the Low-k/Cu structure.

Moreover, in the first or third embodiment disclosed in Japanese Unexamined Patent Publication NO. 2004-342787, a structure is shown in which an insulating layer of a silicon oxide layer is formed right above a copper layer of an upper layer wiring or upper electrode. The silicon oxide layer does not have diffusion resistance to the copper layer. Accordingly, in the structure disclosed in Japanese Unexamined Patent Publication NO. 2004-342787, copper (Cu) is diffused into the insulating layer and this deteriorates the reliability of the insulating layer.

Moreover, the silicon oxide layer is mainly formed by oxidation of source gas. Accordingly, when the silicon oxide layer is formed under the conditions in which Cu of the wiring surface is exposed, there are concerns about an increase in wiring resistance caused by oxidation of Cu, a reduction in adhesiveness with the formed silicon oxide layer, a drop in reliability occurring due to those described above, and the like. As described above, in the method disclosed in Japanese Unexamined Patent Publication NO. 2004-342787, there is an advantage in that it is not necessary to provide an etching stopper layer, but it is thought that there is a disadvantage, on the contrary, in that the reliability deteriorates in the structure disclosed in Japanese Unexamined Patent Publication NO. 2004-342787.

Those described up to now may be shown like FIGS. 33A and 33B. As represented by Japanese Unexamined Patent Publication NO. 2004-342787, in the related art, a memory circuit portion 101 has a structure (add-on structure) in which a multi-layered wiring portion 103 is provided over a capacitive element 90. Accordingly, in a logic circuit portion 102, a wiring portion (lift-up wiring portion 104) for lifting up the multi-layered wiring portion 103 according to the height of the capacitive element 90 is needed in order to ensure the capacitance. As a result, there has been a problem that the multi-layered wiring structure becomes thick.

SUMMARY

In one embodiment, there is provided a semiconductor device including: a semiconductor substrate; a multi-layered wiring structure which is formed over the semiconductor substrate and in which a plurality of wiring layers, each of which is formed by a wiring and an insulating layer, are laminated; and a capacitive element having a lower electrode, a capacitor insulating layer, and an upper electrode which is embedded in the multi-layered wiring structure, wherein at least two or more of the wiring layers are provided between a lower capacitor wiring connected to the lower electrode and an upper capacitor wiring connected to the upper electrode.

Due to the structure in which a capacitive element is embedded in a multi-layered wiring structure and at least two more wiring layers are provided between lower and upper capacitor wirings of the capacitive element, it is possible to suppress an increase in the thickness of the multi-layered wiring structure while ensuring the capacitance of the capacitive element.

BRIEF DESCRIPTION OF THE DRAWINGS

The above and other objects, advantages and features of the present invention will be more apparent from the following description of certain preferred embodiments taken in conjunction with the accompanying drawings, in which:

FIGS. 25A and 25B are sectional views showing procedures of manufacturing a semiconductor device in an example of the third embodiment of the present invention;

FIGS. 26A to 26C are sectional views showing a semiconductor device in an example of a third embodiment of the present invention;

FIGS. 33A to 33D are sectional views for comparing a semiconductor device in the related art with a semiconductor device in an example of the present invention;

FIGS. 34A to 34C are sectional views showing a semiconductor device in an example of an eighth embodiment of the present invention;

FIG. 37 is a plane layout view showing a procedure of manufacturing a semiconductor device in an example of the first embodiment of the present invention shown in FIG. 2A;

FIG. 40 is a plane layout view showing a procedure of manufacturing a semiconductor device in an example of the first embodiment of the present invention shown in FIG. 6A;

FIG. 41 is a plane layout view showing a procedure of manufacturing a semiconductor device in an example of the first embodiment of the present invention shown in FIG. 9A;

FIG. 43 is a plane layout view showing a procedure of manufacturing a semiconductor device in an example of the first embodiment of the present invention shown in FIG. 42A;

FIG. 44 is a plane view showing layout of a semiconductor device in an example of a tenth embodiment of the present invention;

FIG. 45 is a plane view showing layout of a semiconductor device in an example of the tenth embodiment of the present invention;

FIG. 48 is a plane view showing layout of a semiconductor device in an example of an eleventh embodiment of the present invention.

DETAILED DESCRIPTION

Figure 1A:
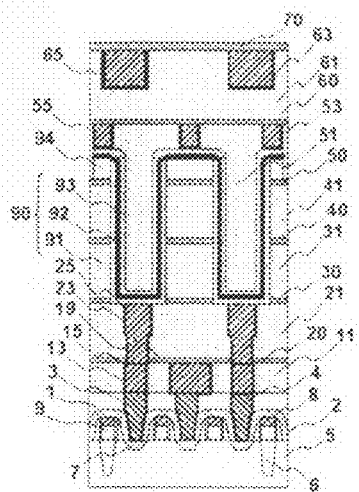
FIGS. 1A to 1C are sectional views showing a semiconductor device according to a first embodiment of the present invention.

The invention will be now described herein with reference to illustrative embodiments. Those skilled in the art will recognize that many alternative embodiments can be accomplished using the teachings of the present invention and that the invention is not limited to the embodiments illustrated for explanatory purposes.

Before describing an embodiment of the present invention in detail, definitions of terms in the embodiment will be described.

An insulating layer is a layer (interlayer insulating layer) for separating wiring materials from each other by insulation, for example. A low dielectric constant insulating layer refers to a material whose relative permittivity is lower than that of a silicon oxide layer (relative permittivity of 4.5) in order to reduce the capacitance between multi-layered wirings for connections between semiconductor elements. Particularly, examples of a porous insulating layer include a porous silica material which has a low relative permittivity by making a silicon oxide layer porous, a hydrogen silsesquioxane (HSQ) layer, and a material which has a low relative permittivity by making SiOCH or SiOC (for example, Black Diamond™ or Aurora™) porous. As this insulating layer, it is also possible to use a layer obtained by making the above layers have lower dielectric constants.

In the embodiments, a metal wiring material and a contact plug material mainly have Cu as a main component. In order to improve the reliability of a metal wiring material, a metal element other than Cu may be included in a member formed of Cu, or a metal element other than Cu may be formed at an upper surface, side surface, or the like of Cu. Moreover, in some of the embodiments, a contact plug material which connects a first layer wiring with a MOSFET formed over a silicon substrate mainly has tungsten (W) as a main component. In this case, a pre-metal insulating layer (PMD) which separates the first layer wiring from the MOSFET formed over the silicon substrate by insulation is a silicon oxide layer excellent in thermal resistance.

A barrier metal layer is a conductive layer which serves as a barrier against diffusion of copper and which covers side and bottom surfaces of wirings in order to prevent a metal element, which forms a wiring or a contact plug, from being diffused to an interlayer insulating layer or a lower layer. For example, when a wiring is formed of a metal element having Cu as a main component, high-melting-point metals, such as tantalum (Ta), tantalum nitride (TaN), titanium (Ti), titanium nitride (TiN), tungsten carbon nitride (WCN), and ruthenium (Ru), their nitrides, or a laminated layer thereof is used. In addition, the metal layer is also used as a barrier metal of a contact plug which uses tungsten as a main component.

A damascene wiring is an embedded wiring formed by embedding a metal wiring material in a groove of an interlayer insulating layer formed beforehand and then removing surplus metal, which is not located in the groove, by CMP, for example. When the damascene wiring is formed of Cu, a wiring structure is generally used in which the side surface and outer periphery of a Cu wiring are covered by a barrier metal and the upper surface of the Cu wiring is covered by an insulating barrier layer (also referred to as a cap layer) with resistance to copper diffusion (Cu barrier property).

The chemical mechanical polishing (CMP) method is a technique of flattening the unevenness of the wafer surface, which occurs in the process of forming multi-layered wirings, by polishing the wafer surface by bringing the wafer surface into contact with a rotating polishing pad while pouring the polishing solution to the wafer surface. Particularly, the damascene method is used to obtain the flat wiring surface by embedding metal in a wiring groove or a via hole and then removing a surplus metal portion.

A semiconductor substrate is a substrate formed with a semiconductor device. Examples of the semiconductor substrate include not only a single crystal silicon substrate but also a silicon on insulator (SOI) substrate and a substrate for manufacturing a thin film transistor (TFT) and liquid crystal.

A hard mask is an insulating layer which is laminated over an interlayer insulating layer to protect it when it is difficult to directly perform plasma etching or CMP due to a drop in mechanical strength or a drop in process resistance caused by a reduction in the dielectric constant of the interlayer insulating layer.

The plasma CVD method is, for example, a technique of supplying a gaseous material into a decompressed reaction chamber continuously, exciting molecules by plasma energy, and forming a continuous layer over a substrate by gas reaction or substrate surface reaction.

Examples of the PVD method include not only the normal sputtering method but also high-directivity sputtering methods for improvement in embedding characteristic, improvement in the quality of layers, or improvement in uniformity of the layer thickness within the wafer surface, such as a long slow sputtering method, a collimated sputtering method, and an ionized sputtering method. When sputtering an alloy, a metal other than a main component is contained beforehand below the solid solubility limit within the metal target, so that the formed metal layer can serve as an alloy layer. In the present invention, the PVD method may be used mainly when forming a Cu seed layer in forming a damascene Cu wiring or when forming a barrier metal layer.

First Embodiment

Hereinafter, a first embodiment of the present invention will be described with reference to the accompanying drawings. In the first embodiment, the same components are denoted by the same titles, and the detailed description will not be repeated.

A semiconductor device according to the first embodiment includes: a semiconductor substrate (silicon substrate 5); a multi-layered wiring structure which is formed over the silicon substrate 5 and in which a plurality of wiring layers (third layer wiring 35 and interlayer insulating layer 31 of the third layer, fourth layer wiring 45 and interlayer insulating layer 41 of the fourth layer, fifth layer wiring 55 and interlayer insulating layer 51 of the fifth layer, and sixth layer wiring 65 and interlayer insulating layer 61 of the sixth layer) formed by wirings (third layer wiring 35, fourth layer wiring 45, fifth layer wiring 55, and sixth layer wiring 65) and insulating layers (interlayer insulating layer 31 of the third layer, interlayer insulating layer 41 of the fourth layer, interlayer insulating layer 51 of the fifth layer, and interlayer insulating layer 61 of the sixth layer) are laminated; and a capacitive element 90 which is embedded in the multi-layered wiring structure and which is formed by a lower electrode (lower electrode layer 91), a capacitor insulating layer (capacitor insulating layer 92), and an upper electrode (upper electrode layer 93). In addition, the semiconductor device according to the first embodiment has a feature in that at least two or more of the wiring layers (third layer wiring 35 and interlayer insulating layer 31 of the third layer, fourth layer wiring 45 and interlayer insulating layer 41 of the fourth layer, and fifth layer wiring 55 and interlayer insulating layer 51 of the fifth layer) are provided between a lower capacitor wiring (second layer wiring 25) connected to the lower electrode layer 91 and an upper capacitor wiring (fifth layer wiring 55 as a plate line wiring) connected to the upper electrode layer 93.

Figure 1B:
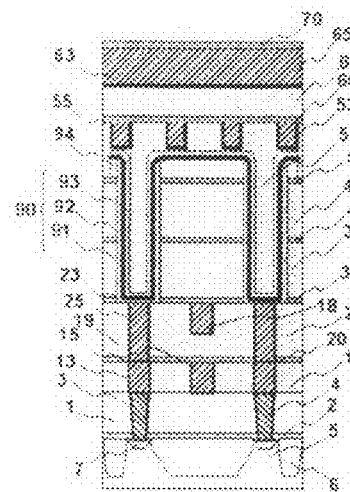
Figure 1C:
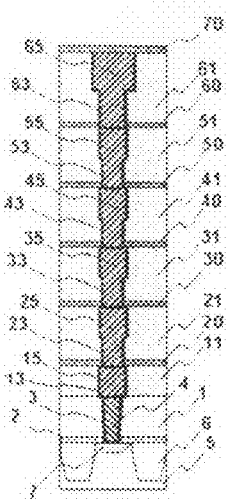

FIGS. 1A to 1C are sectional views showing the semiconductor device according to the first embodiment of the present invention. FIGS. 2A to 12B, 42A and 42B are examples of the sectional view showing procedures in a method of manufacturing the semiconductor device in FIGS. 1A to 1C. FIGS. 1A and 1B at the left and middle sides are sectional views of a memory circuit region, and show cross sections rotated by 90° from each other. In addition, FIG. 1C at the right side shows a typical sectional view of a logic circuit region. FIGS. 2A, 3A, 4A, 5A, 6A, 7A, 8A, 9A, 10A, 11A, 12A, and 42A at the left side show typical sectional views of memory circuit regions, and FIGS. 2B, 3B, 4B, 5B, 6B, 7B, 8B, 9B, 10B, 11B, 12B, and 42B at the right side show typical sectional views of logic circuit regions. FIGS. 37A to 41 and 43 are top views (plane layout views) of FIGS. 2A, 3A, 5A, 6A, 9A, and 42A. In addition, FIGS. 13A and 13B and 14A and 14B at the left and middle sides are sectional views of memory circuit regions and show cross sections rotated by 90° from each other. In addition, FIGS. 13C and 14C at the right side show typical sectional views of logic circuit regions.

The multi-layered wiring structure is a structure in which a wiring layer formed by the third layer wiring 35 and the interlayer insulating layer 31 of the third layer, a wiring layer formed by the fourth layer wiring 45 and the interlayer insulating layer 41 of the fourth layer, a wiring layer formed by the fifth layer wiring 55 and the interlayer insulating layer 51 of the fifth layer, and a wiring layer formed by the sixth layer wiring 65 and the interlayer insulating layer 61 of the sixth layer are laminated, for example. In the multi-layered wiring structure, different wiring layers may be further laminated. In the first embodiment, the multi-layered wiring structure is a multi-layered wiring structure of a typical logic circuit region. In the multi-layered wiring structure of the logic circuit region, it is common that the thickness of each wiring or wiring layer which forms a multi-layered wiring layer located at the upper layer is larger than that of a multi-layered wiring layer located at the lower layer. In the first embodiment, however, the thickness of each wiring or wiring layer which forms the multi-layered wiring layer is not particularly limited. Like the related art, the thicknesses of some or all wiring layers or wirings may be equal, or the thicknesses of wiring layers or wirings may increase from the lower layer toward the upper layer.

Moreover, at least in a region where a capacitive element is provided, the heights (thicknesses) of wiring layers and the heights (thicknesses) of wirings may be equal. That is, in a region where the capacitive element 90 is embedded, for example, the thicknesses of the third layer wiring 35, fourth layer wiring 45, and fifth layer wiring 55 are equal, and the thicknesses of the third, fourth, and fifth wiring layers in which the wirings are provided may be equal. In addition, the thickness of a wiring layer or wiring in a region where the capacitive element 90 is not embedded may be equal to or different from that of a wiring layer or wiring in the region where the capacitive element 90 is embedded. In the first embodiment, as shown in FIGS. 1A to 1C, the thicknesses of the second layer wiring 25, third layer wiring 35, . . . , sixth layer wiring 65 are equal, and the thicknesses of wiring layers in which the wirings are provided are also equal. In the first embodiment, the thicknesses of wirings and wiring layers are assumed to be the thicknesses in the normal direction of the silicon substrate 5.

In this multi-layered wiring structure, wiring layers of the memory circuit region and wiring layers of the logic circuit region are provided at the same layers. That is, the third layer wiring layer, . . . , fifth layer wiring layer of the memory circuit region and the third layer wiring layer, . . . , fifth layer wiring layer of the logic circuit region are the same layers, respectively. In the first embodiment, the capacitive element 90 is embedded in the multi-layered wiring structure of the memory circuit region. In addition, the capacitive element 90 is provided over at least two or more wiring layers. Accordingly, it is possible to obtain the desired capacitance by changing the number of wiring layers, through which the capacitive element 90 passes, without changing the number of wiring layers of the multi-layered wiring structure. In addition, as described above, the multi-layered wirings of the memory circuit region where the capacitive element 90 is embedded and the multi-layered wirings of the logic circuit region where the capacitive element 90 is embedded are formed in the same layers. Accordingly, it is not necessary to additionally provide multi-layered wirings of the logic circuit region. As a result, the compact multi-layered wiring structure can be provided.

Since the capacitive element 90 is embedded in the multi-layered wiring structure as shown in FIGS. 1A to 1C, the lower electrode layer 91 is provided to pass through the interlayer insulating layer 51 of the fifth layer, the interlayer insulating layer 41 of the fourth layer, and the interlayer insulating layer 31 of the third layer from above, and a recessed portion is formed in the multi-layered wiring structure. The capacitor insulating layer 92 is formed to be in contact with the bottom and side surfaces of the recessed portion. In addition, the upper electrode layer 93 is formed to be in contact with the capacitor insulating layer 92. By providing the lower electrode layer 91, the capacitor insulating layer 92, and the upper electrode layer 93 as described above, the capacitive element 90 is embedded in the multi-layered wiring structure. In addition, the capacitive element 90 is embedded in the multi-layered wiring structure. Accordingly, as shown in FIGS. 1A to 1C, in the interlayer insulating layer 51 of the fifth layer provided with the upper electrode layer 93 of the capacitive element 90, the fifth layer wiring 55 as an upper capacitor wiring connected to the upper electrode layer 93 is provided over the upper electrode layer 93.

The position where the capacitive element 90 is embedded in the multi-layered wiring structure is not particularly limited as long as at least two or more wiring layers are provided between the lower capacitor wiring (second layer wiring 25) and the upper capacitor wiring (fifth layer wiring 55 as a plate line wiring). The capacitive element 90 may be formed in the multi-layered wiring layer located at the lower layer which is being most miniaturized.

Moreover, as shown in FIGS. 1A to 1C, the capacitive element 90 of the memory circuit region where the capacitive element 90 is provided is embedded in the multi-layered wiring structure. Accordingly, in the first embodiment, in the multi-layered wiring structure, a column decode wiring 18 is formed in an upper layer of the lower capacitor wiring. Since one or both of a row decode wiring 17 and the column decode wiring 18 are provided in the same layer as the capacitive element 90 or in the same layer as the lower capacitor wiring, it becomes unnecessary to use the upper wiring. Accordingly, the number of wiring layers of the memory circuit region can be reduced. In this case, the upper layer of the memory circuit region may be used for wirings of the logic circuit region or for connection between the circuit regions. As a result, the chip area can be reduced.

Moreover, in the multi-layered wiring structure, the thicknesses of different wiring layers, for example, the thicknesses of the third and fourth wiring layers may be set to be equal. In addition, the thickness of a wiring layer of the memory circuit region where the capacitive element 90 is provided may be set to be equal to that of a wiring layer of the logic circuit region where the capacitive element 90 is not provided. In addition, the capacitive element 90 may be embedded in the multi-layered wiring structure without changing the thickness of the wiring layer of the multi-layered wiring structure. In this case, the desired capacitance of the capacitive element 90 can be obtained by the wiring layer, through which the capacitive element 90 passes, without increasing the thickness of the wiring layer of the multi-layered wiring structure.

Next, a method of manufacturing the semiconductor device according to the first embodiment will be described.

Figure 2A:
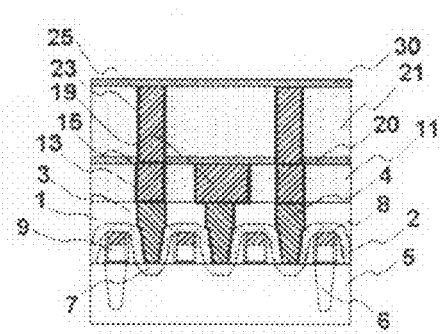
FIGS. 2A and 2B are sectional views showing procedures of manufacturing a semiconductor device in an example of the first embodiment of the present invention.
Figure 2B:
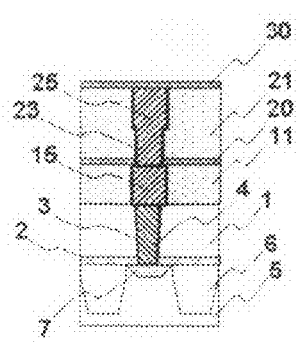

FIGS. 2A and 2B show a substrate with a structure after formation of a MOS transistor 9 and the second layer wiring 25, which has been generated by using a typical method of forming an integrated circuit.

The semiconductor device according to the first embodiment further includes a first diffusion layer (diffusion layer 7) formed near the surface of the silicon substrate 5, a second diffusion layer (diffusion layer 7) formed near the surface of the silicon substrate 5, a gate dielectric layer provided in the silicon substrate 5 between the first diffusion layer (diffusion layer 7) and the second diffusion layer (diffusion layer 7), and a gate electrode 8 provided over the gate dielectric layer. Moreover, in the semiconductor device according to the first embodiment, a field effect transistor (MOS transistor 9) is formed by the silicon substrates 5, the first diffusion layer (diffusion layer 7), the second diffusion layer (diffusion layer 7), the gate dielectric layer, and the gate electrode 8.

It is preferable that the gate dielectric layer of the MOS transistor 9 formed over the silicon substrate 5 is a high dielectric constant gate dielectric layer. For example, a high dielectric constant gate dielectric layer containing a silicon oxynitride, such as SiON, or Hf, such as an Hf oxynitride, may be used as the high dielectric constant gate dielectric layer. Specifically, a high dielectric constant insulating layer in which an Hf oxide or an Hf silicate is contained or in which nitrogen is introduced into the Hf oxide or Hf silicate may be used. The gate dielectric layer may be a single layer or may be a multi-layer including the single layers.

Moreover, in a gate electrode material, polysilicon or its upper surface layer is covered by metal silicide, such as Ni, Co, Ti, and Pt. In addition, a metal gate electrode containing Ti, Ta, Al, or conductive nitrides thereof in a part of the gate electrode may be used. Particularly in the case of a metal gate electrode, not only an effect of improving the driving current of a transistor in a logic portion is obtained, but also an effect of reducing the resistance of a word line of a DRAM portion is obtained because the metal gate electrode forms the word line of the DRAM portion. Accordingly, by combination with the eDRAM structure in which a capacitive element portion is embedded in a multi-layered wiring layer, the operation can be performed at higher speed.

The MOS transistor 9 may be of an N or P type. In addition, an N type transistor and a P type transistor may be formed over the same silicon substrate 5. The diffusion layer 7 shown in FIGS. 2A and 2B indicates a first diffusion layer and a second diffusion layer, one of the first and second diffusion layers is a source diffusion layer, and the other one is a drain diffusion layer. Moreover, in FIGS. 2A and 2B, reference numeral 1 denotes an insulating layer between contact layers, reference numeral 2 denotes an etch stop layer, reference numeral 3 denotes a contact barrier metal layer, reference numeral 4 denotes a contact plug, reference numeral 5 denotes a silicon (Si) substrate, reference numeral 6 denotes an element separation shallow trench isolation (STI), reference numeral 7 denotes a diffusion layer, and reference numeral 8 denotes a gate electrode. In addition, reference numeral 11 denotes an interlayer insulating layer of a first layer, reference numeral 13 denotes a first layer wiring barrier metal layer, reference numeral 15 denotes a first layer wiring, reference numeral 20 denotes a cap layer of a first layer wiring, reference numeral 23 denotes a second layer wiring barrier metal layer, reference numeral 25 denotes a second layer wiring, and reference numeral 30 denotes a cap layer of a second layer wiring. In addition, a bit line 19 is formed simultaneously with the first layer wiring 15 and serves as a bit line in a memory circuit portion.

In addition, since the bit line 19 is formed in the same layer as the first layer wiring 15, a wiring layer with only bit lines which is found in Japanese Unexamined Patent Publication NO. 2004-342787 or the like does not exist. By the structure shown in the first embodiment, the number of layers can be effectively utilized in the multi-layered wiring structure.

In FIGS. 2A and 2B, the insulating layer 1 between contact layers is a silicon oxide layer, the contact plug 4 is formed of tungsten, and the contact barrier metal layer 3 is a laminated layer of titanium nitride/titanium. In addition, the interlayer insulating layer 11 of the first layer and the interlayer insulating layer 21 of the second layer are low dielectric constant insulating layers and are SiOCH layers, more specifically, molecular pore stack (MPS) layers. Details of the MPS layer are disclosed in M. Ueki et al., IEEE IEDM, pp 973-976 (2007). The first layer wiring barrier metal layer 13 is a laminated layer of tantalum/tantalum nitride, and the first layer wiring is formed of copper. In addition, the cap layer 20 of the first layer wiring and the cap layer 30 of the second layer wiring are silica amorphous carbon composite (SCC) layers. Details of the SCC layer are also disclosed in M. Ueki et al., IEEE IEDM, pp 973-976 (2007), like the MPS layer.

The MPS layer and the SCC layer will be briefly described below. The MPS layer is formed by using six-membered cyclic siloxane as main skeleton, and using organic siloxane having an organic group as a functional group, as base material. The organic functional group bonding to silicon atom is an unsaturated hydrocarbon group and an alkyl group. The SCC layer is formed by using the organic silane material where an unsaturated hydrocarbon group, an alkoxy group, and an alkyl group directly bond to silicon atom. The layer is the structure which contains an amorphous carbon structure and an unsaturated hydrocarbon bonding in the layer. The unsaturated hydrocarbon group in base material of any of the MPS layer and the SCC layer includes a vinyl group, a propenyl, an isopropenyl group, a 1-methyl-propenyl group, a 2-methyl-propenyl group, a 1,2-dimethyl-propenyl group, or the like. In particular, the preferable unsaturated hydrocarbon group is a vinyl group. The alkoxy group in base material of any of the MPS layer and the SCC layer is the structure where an alkyl group bonds to oxygen atom. The alkyl group directly bonding to silicon atom, and the alkyl group consisting of an alkoxy group include a methyl group, an ethyl group, a propyl group, an isopropyl group, a butyl group, an isobutyl group, a sec-butyl group, a tert-butyl group, or the like. The alkyl group bonding to silicon of the MPS layer material is preferably a functional group which is large volume and functions as a steric hindrance group, such as an isopropyl group, an isobutyl group, a tert-butyl group, or the like. In particular, one of the more preferable functional group is an isopropyl group. In other words, triisopropyl trivinyl tricyclosiloxane is more preferred. As the alkoxy group and the alkyl group bonding to silicon of the SCC layer material, a methoxy group and an isopropyl group are more preferred. In other words, isopropyl dimethoxy vinyl siloxane is more preferred. Micropore (mainly 0.5 nm or less) structure is introduced in the MPS layer by using these materials. The SCC layer is a kind of SiOCH layer with resistance to copper diffusion. Relative permittivity is approximately 3.1, while mechanical strength is as high as 20 GPa. Since the layer is formed by strong surface reaction, step coverage is excellent. In these layers, the composition of carbon is high, as compared with the SiOCH layer which is generally known. The ration of silicon/oxygen/carbon is about 2 times carbon in the SCC layer, and about 4 times carbon in the MPS layer with relation to the SiOCH layer, based on Si. The relative ratio of oxygen is at least about ¾ in the SCC layer and about ½ in the MPS layer as compared with general SiOCH layer. These layers is formed by not the plasma CVD method which dissociates and activates material in plasma, but the plasma polymerization method, so as to activate an unsaturated hydrocarbon with holding silica skeleton, and to be easy to control a chemical structure of an insulating layer. The composition difference of the MPS layer and the SCC layer is important in forming capacitive element opening.

A method of forming the second layer wiring 25 will be briefly described. The first layer wiring 15 is formed, the cap layer 20 of the first layer wiring which is formed by an SCC layer is formed, and then the MPS layer is formed as the interlayer insulating layer 21 of the second layer. Subsequently, as a mask at the time of subsequent processing, a silicon oxide (not shown in the drawings) layer is formed. Then, an opening of the second layer wiring is formed by the so-called dual damascene process using lithography and dry etching. In this case, a part of the opening includes a via hole for electrical connection with the first layer wiring 15. The second layer wiring barrier metal layer 23 is deposited in the opening by the sputtering method, and then a copper to become a copper plated seed layer is deposited. Then, a copper is embedded by the plating method. The copper used herein may include a metal additive, such as aluminum or silver. The excessive barrier metal layer and copper are removed such that the barrier metal layer 23 and the copper remain in the opening of the second layer wiring by using a technique, such as CMP, thereby forming the second layer wiring 25. Since the silicon oxide layer is removed in this process, it does not remain over the interlayer insulating layer 21 of the second layer. Then, the cap layer 30 of the second layer wiring, which is formed by an SCC layer similar to the first layer, is formed. Here, the silicon oxide layer may also be partially provided in a lower portion of the capacitor insulating layer other than the opening of the capacitive element. In the subsequent process, an opening of the third layer wiring, . . . , an opening of the sixth layer wiring can be formed similar to the opening of the second layer wiring. A third layer wiring barrier metal layer 33, a fourth layer wiring barrier metal layer 43, a fifth layer wiring barrier metal layer 53, and a sixth layer wiring barrier metal layer 63 which are shown in FIGS. 1A to 1C can be formed similar to the first layer wiring barrier metal layer 13 or the second layer wiring barrier metal layer 23. A cap layer 60 of the fifth layer wiring and a cap layer 70 of the sixth layer wiring which are shown FIGS. 1A to 1C can be formed similar to the cap layer 30 of the second layer wiring.

In the first embodiment, an insulating layer with a single layer is used as the interlayer insulating layer and the cap layer. However, a laminated structure of a plurality of kinds of insulating layers may also be used as the interlayer insulating layer and the cap layer. For example, a laminated structure of an MPS layer and a SiOCH layer may be used as the interlayer insulating layer, and a laminated structure of a SiC layer and a SiCN layer may be used as the cap layer. FIG. 37 is a plane layout view before the cap layer 30 is formed, in which the column decode wiring 18, the interlayer insulating layer 21 of the second layer, and the second layer wiring 25 are formed.

Figure 3A:
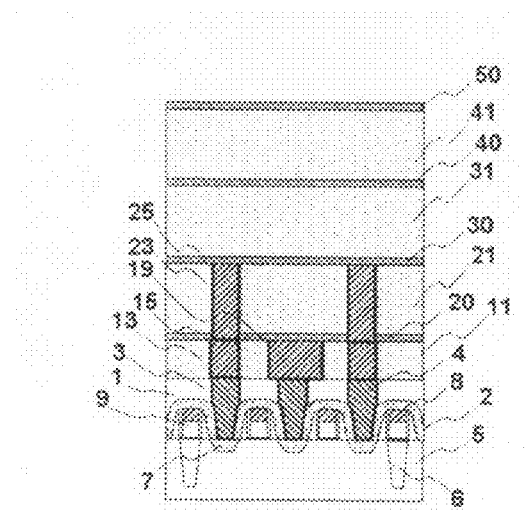
FIGS. 3A and 3B are sectional views showing procedures of manufacturing a semiconductor device in an example of the first embodiment of the present invention.
Figure 3B:
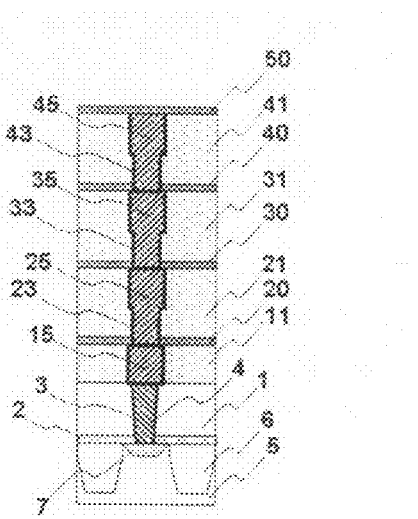
Figure 38:
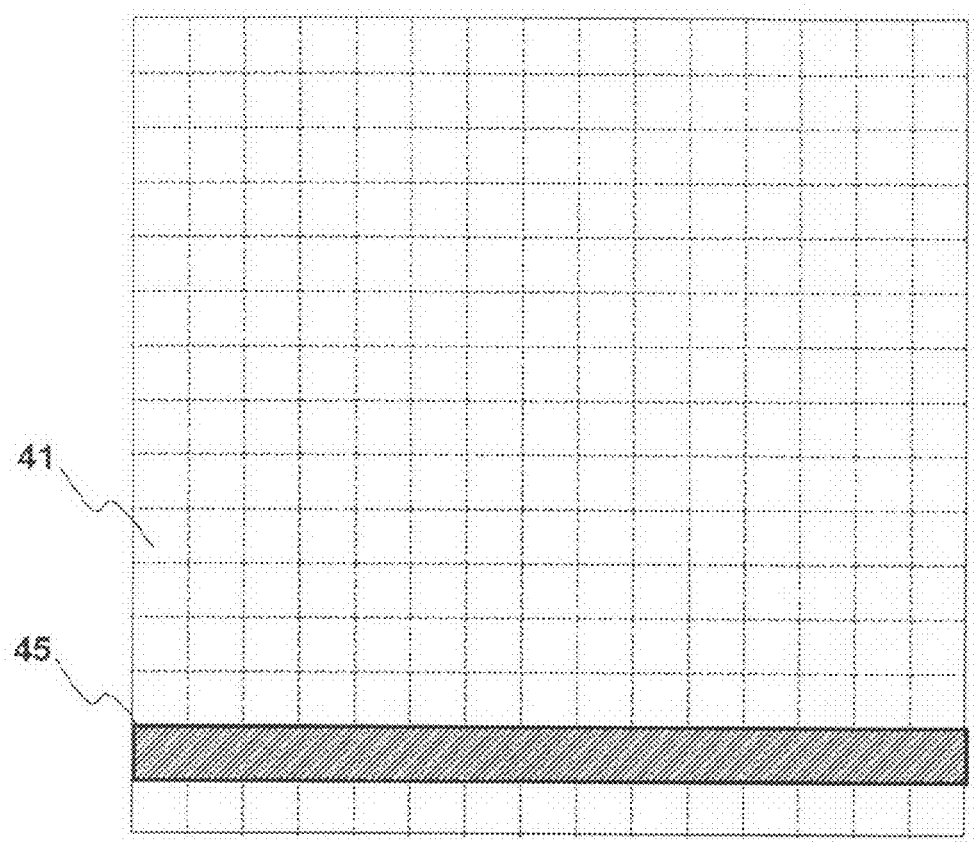
FIG. 38 is a plane layout view showing a procedure of manufacturing a semiconductor device in an example of the first embodiment of the present invention shown in FIG. 3A.

Moreover, referring to FIGS. 3A and 3B, the third layer wiring 35 and the fourth layer wiring 45 are formed. The method of forming the third layer wiring 35 and the fourth layer wiring 45 is the same as the method of forming the second layer wiring 25. Here, a wiring layer is formed only in the logic circuit region since a capacitive element is formed in the memory circuit region later. In the first embodiment, the case where the height of the capacitive element is lower than that of three layers of the logic circuit portion is shown. However, when the height of the capacitive element is set to be higher than that of three layers of the logic circuit portion, one more layer is formed for the logic circuit portion. FIG. 38 is a plane layout view before a cap layer 50 is formed, in which the interlayer insulating layer 41 of the fourth layer and the fourth layer wiring 45 are formed.

Figure 4A:
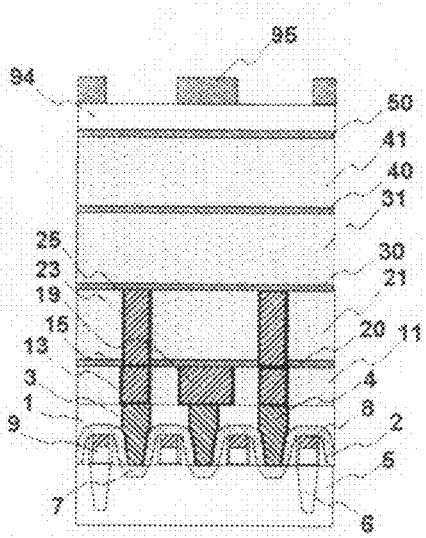
FIGS. 4A and 4B are sectional views showing procedures of manufacturing a semiconductor device in an example of the first embodiment of the present invention.
Figure 4B:
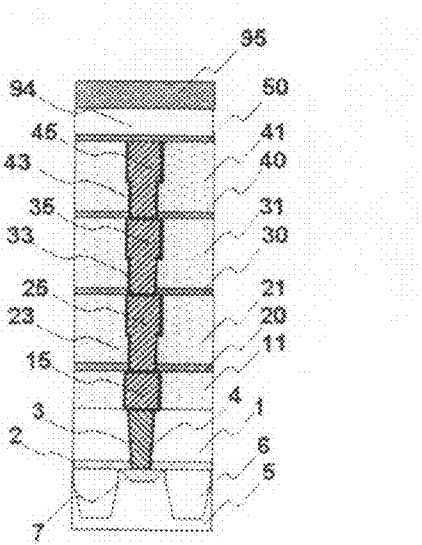

Then, the cap layer 50 of the fourth layer wiring is deposited as shown in FIGS. 4A and 4B, and then a hard mask insulating layer 94 is formed. Then, a cylinder processing resist layer 95 is formed by lithography.

Here, a silicon oxide layer is used as the hard mask insulating layer 94. However, a laminated structure including another insulating layer may also be used as the hard mask insulating layer 94. In addition, it is also possible to adopt a multi-layered structure in which an antireflection layer is provided between the hard mask insulating layer 94 and a resist layer. In any case, it is preferable that the hard mask insulating layer 94 is an insulating layer with an effect of protecting the cap layer 50 of the fourth layer wiring in the process of forming a capacitive element. Specifically, a silicon nitride layer, a silicon oxynitride layer, and the like may be mentioned in addition to the silicon oxide layer.

Figure 5A:
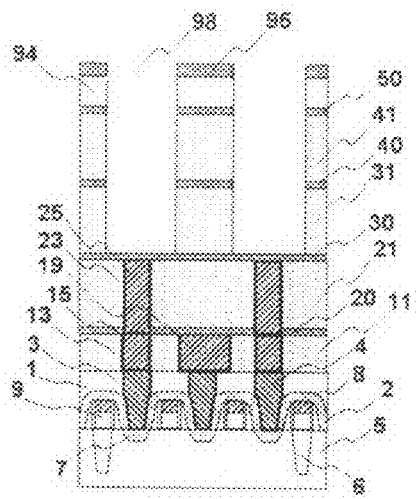
FIGS. 5A and 5B are sectional views showing procedures of manufacturing a semiconductor device in an example of the first embodiment of the present invention.
Figure 5B:
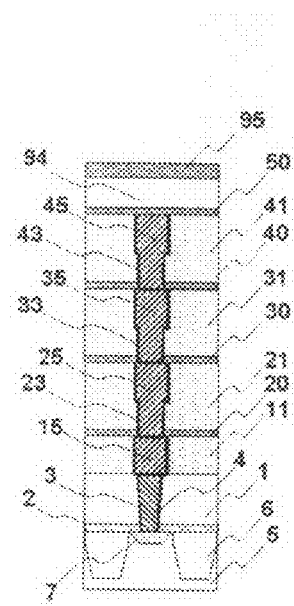
Figure 39:
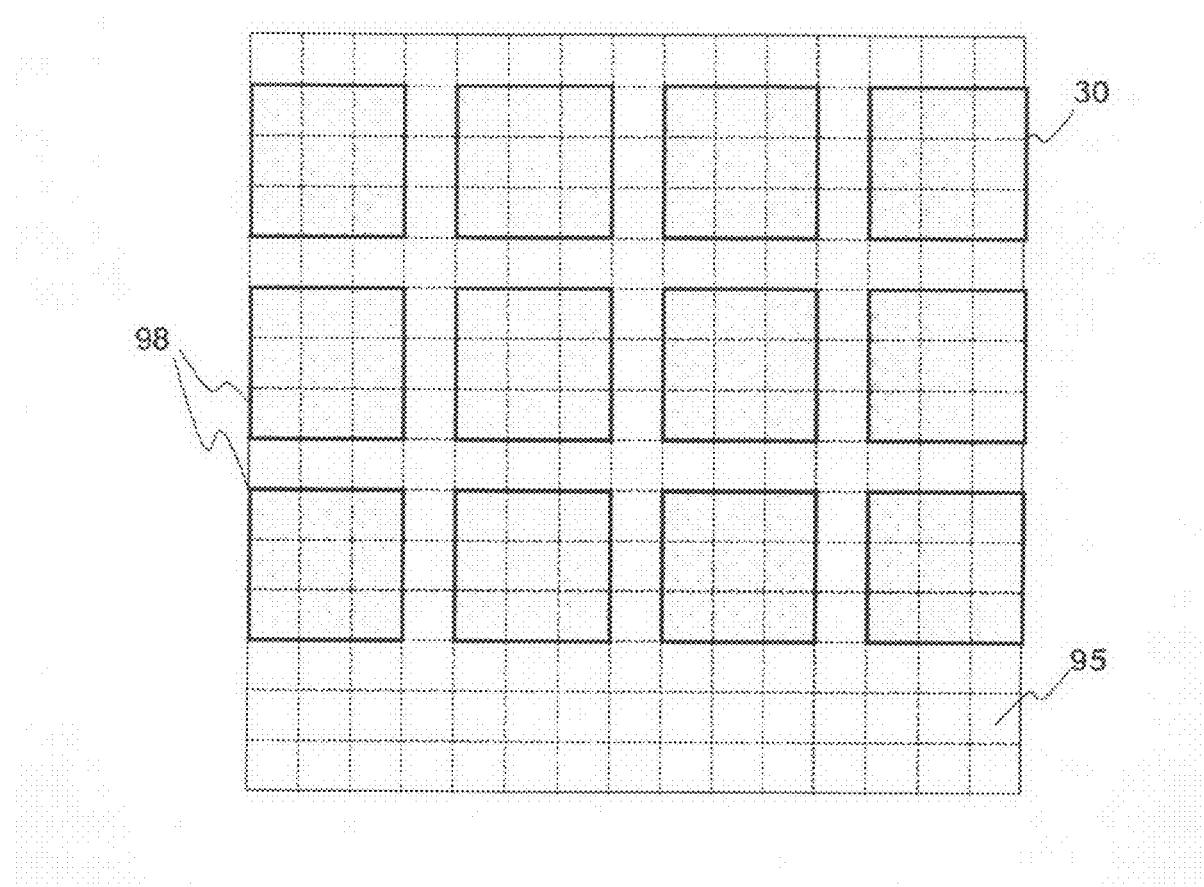
FIG. 39 is a plane layout view showing a procedure of manufacturing a semiconductor device in an example of the first embodiment of the present invention shown in FIG. 5A.
Figure 42A:
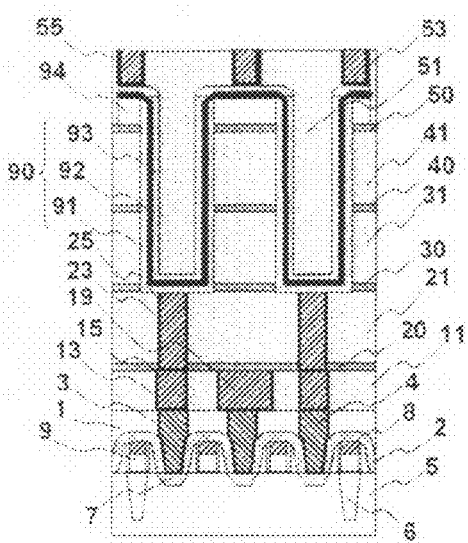
FIGS. 42A and 42B are sectional views showing procedures of manufacturing a semiconductor device in an example of the first embodiment of the present invention.
Figure 42B:
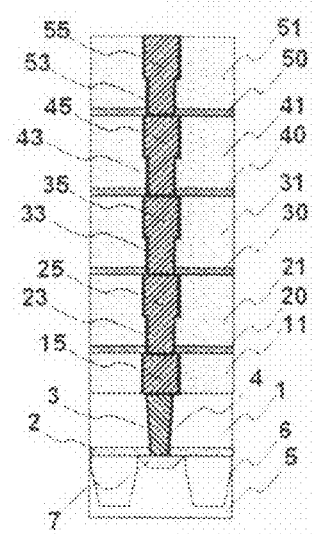

Then, as shown in FIGS. 5A and 5B, a capacitive element opening 98 is formed by dry etching. In this case, the cap layer 30 of the second layer wiring is not etched in order to prevent oxidation of the second layer wiring. FIG. 39 is a plan layout view of FIG. 5A, in which the whole surface is covered with the cylinder processing resist layer 95. The cap layer 30 of the second layer wiring is formed in the capacitive element opening 98 to be the capacitive element. By forming the capacitive element 90 in a rectangular shape like the first embodiment, an exposure including an optical proximity correction and a forming process such as dry etching process become easy. Particularly in a next generation of the 32 nm and 28 nm technology the optical proximity correction becomes complex. Forming each element pattern in a simple rectangular shape or a linear shape is highly advantageous, in order to increase the bit density per unit area or to obtain the shape as designed.

Although the interlayer insulating layer and the cap layer are alternately etched by dry etching when forming the capacitive element opening 98, an MPS layer is used as the interlayer insulating layer and an SCC is used as the cap layer in the first embodiment. Accordingly, this is the structure in which the SiOCH layer is laminated. Since the composition of carbon of the two layers is greatly different as described above, it becomes easy to control the ratio of etching rates, so-called etching selectivity of the MPS layer/SCC layer by studying the processing conditions based on dry etching. Accordingly, the capacitive element opening 98 can be opened deep by setting the etching selectivity of the SCC layer, which is a cap layer, to be small while etching the MPS layer which is an interlayer insulating layer. On the contrary, etching may be stopped at the bottom of the cylinder opening by setting the etching selectivity of the MPS layer/SCC layer to be large. Although the interlayer insulating layer is etched, it is possible to set the etching rate of the cap layer to be relatively noticeably small. That is, due to the existence of carbon, it is possible to select the condition in which the etching rate changes and the condition in which the etching rate does not change. By using such a structure in which the degree of freedom of processing is high, the satisfactory shape of the capacitive element opening 98 can be acquired. Here, assuming that the carbon/silicon ratio of the cap insulating layer is cap insulating layer (C/Si) and the carbon/silicon ratio of the low dielectric constant SiOCH layer is low dielectric constant SiOCH layer (C/Si), for example, the relationship of cap insulating layer (C/Si)/low dielectric constant SiOCH layer (C/Si)<2 may be satisfied.

Figure 6A:
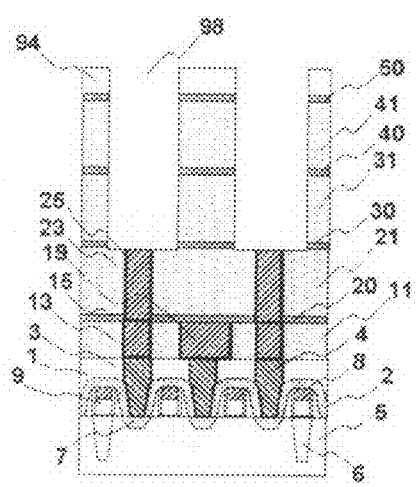
FIGS. 6A and 6B are sectional views showing procedures of manufacturing a semiconductor device in an example of the first embodiment of the present invention.
Figure 6B:
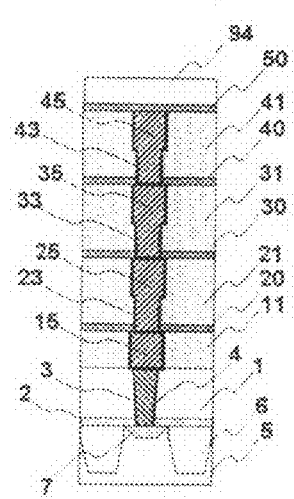

Then, the cylinder processing resist layer is removed by ashing, and the cap layer 30 of the second layer wiring is etched back by dry etching in order to connect a lower electrode of the capacitive element to the second layer wiring 25 serving as a wiring of a lower layer (FIGS. 6A and 6B). FIG. 40 is a plain layout view of FIG. 6A, in which the whole surface is covered with the hard mask insulating layer 94. The interlayer insulating layer 21 of the second layer and the second layer wiring 25 are formed in the capacitive element opening 98 to be the capacitive element.

Figure 7A:
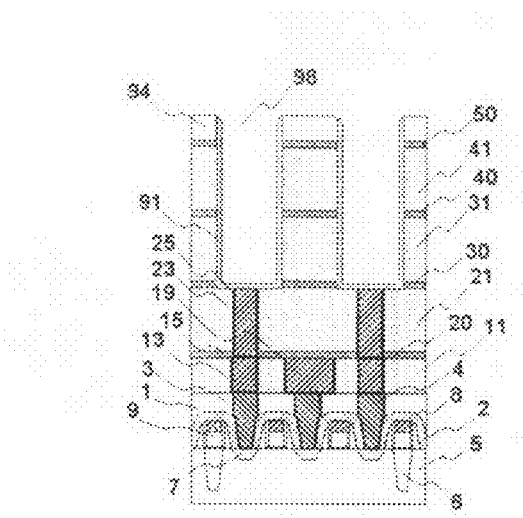
FIGS. 7A and 7B are sectional views showing procedures of manufacturing a semiconductor device in an example of the first embodiment of the present invention.
Figure 7B:
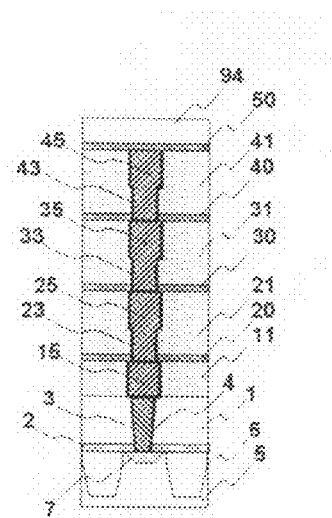

Then, the lower electrode layer 91 serving as a lower electrode of the capacitive element is formed, and then a lower electrode processing resist layer (not shown in the drawings) is formed by lithography. The lower electrode layer 91 is etched back using the lower electrode processing resist layer as a mask, and then the lower electrode processing resist layer is removed by ashing (FIGS. 7A and 7B). In addition, the lower capacitor wiring may be provided such that the upper surface of the lower capacitor wiring and the upper surface of the wiring of a wiring layer provided with the lower capacitor wiring are coplanar.

Figure 8A:
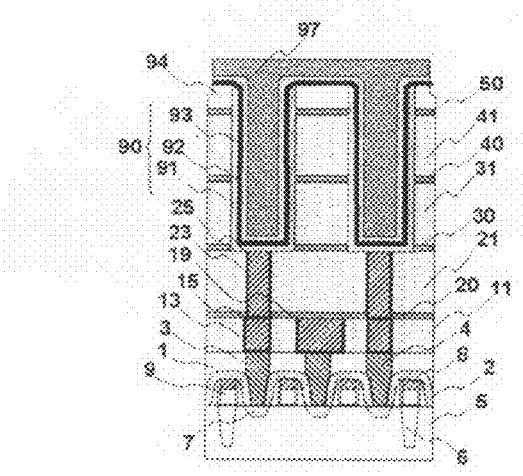
FIGS. 8A and 8B are sectional views showing procedures of manufacturing a semiconductor device in an example of the first embodiment of the present invention.
Figure 8B:
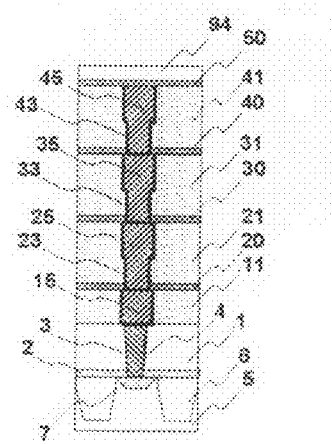

Then, the capacitor insulating layer 92 and the upper electrode layer 93 are formed, and an upper electrode processing resist layer 97 serving as a mask at the time of processing is formed by lithography. The capacitor insulating layer 92 and the upper electrode layer 93 are etched by dry etching using the upper electrode processing resist layer 97 as a mask. In this case, over-etching is performed for uniformity, but a part of the hard mask insulating layer 94 is etched due to the over-etching (FIGS. 8A and 8B). In addition, the upper capacitor wiring may be provided such that the upper surface of the upper capacitor wiring and the upper surface of the wiring of a wiring layer provided with the upper capacitor wiring are coplanar.

As materials used for the capacitive element 90, Ti, TiN, Ta, TaN, Ru, or the laminated structure thereof may be mentioned for the upper electrode layer 93 and the lower electrode layer 91. In addition, as the capacitor insulating layer 92, a layer formed by adding lanthanoid, such as Tb, Er, or Yb, in zirconium dioxide ($ZrO_2$), zirconium alminate ($ZrAlO_x$), or zirconium dioxide may be mentioned.

The hard mask insulating layer 94 serves to protect especially a cap layer, which exists at a lower layer of a hard mask layer in a logic circuit portion, and a copper wiring located below the cap layer in the above-described ashing and etching processes. Particularly when the interlayer insulating layer or the cap layer has no resistance to oxygen plasma or etching process of the capacitor layer, the copper wiring of the logic circuit portion is oxidized if a hard mask layer does not exist. As a result, the resistance is increased or the reliability is reduced, and the performance of the logic circuit portion deteriorates or malfunction occurs.

Figure 9A:
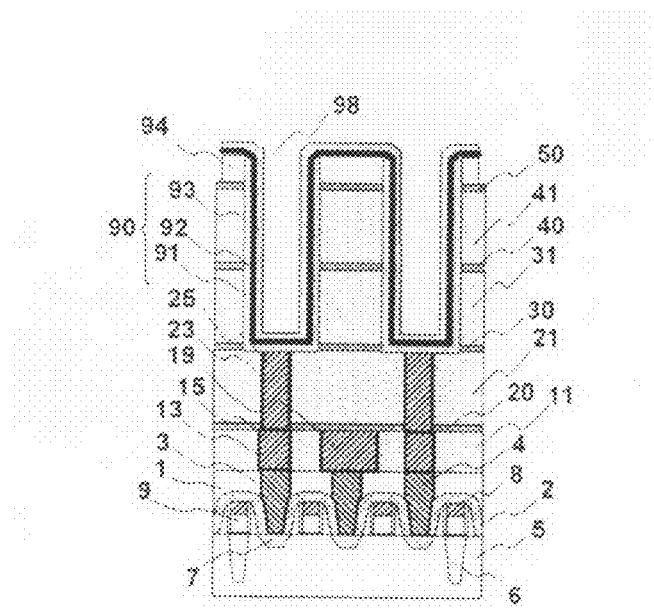
FIGS. 9A and 9B are sectional views showing procedures of manufacturing a semiconductor device in an example of the first embodiment of the present invention.
Figure 9B:
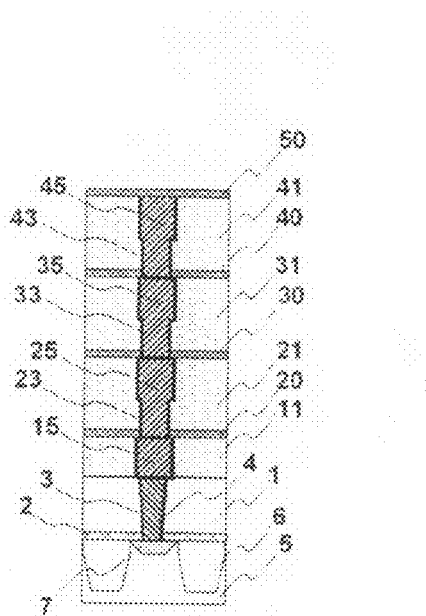

Then, the upper electrode processing resist layer 97 is removed by ashing, in the same manner as in the lower electrode processing. Then, the hard mask insulating layer 94 is etched back using the upper electrode as a mask, such that the cap layer 50 of the fourth layer wiring is exposed (FIGS. 9A and 9B). As a result, the hard mask insulating layer 94 remains only in a region where the capacitor layer and the upper electrode exist. FIG. 41 is a plain layout view of FIG. 9A, in which the almost whole surface of the memory circuit region is covered with the upper electrode layer 93. The capacitive element opening 98 to be the capacitive element is formed and, the cap layer 50 of the fourth layer wiring is formed in the region on which the capacitive element does not exist.

The structure in which a part of the hard mask insulating layer 94 remains in the region where a capacitor layer and an upper electrode exist is a most preferable structure when the capacitive element 90 is embedded in a multi-layer wiring and an interlayer insulating layer of the multi-layered wiring is formed as a low dielectric constant layer like the first embodiment. When the capacitive element 90 is formed in the multi-layered wiring by the process of the first embodiment, the hard mask insulating layer 94 necessarily remains in the region.

Figure 10A:
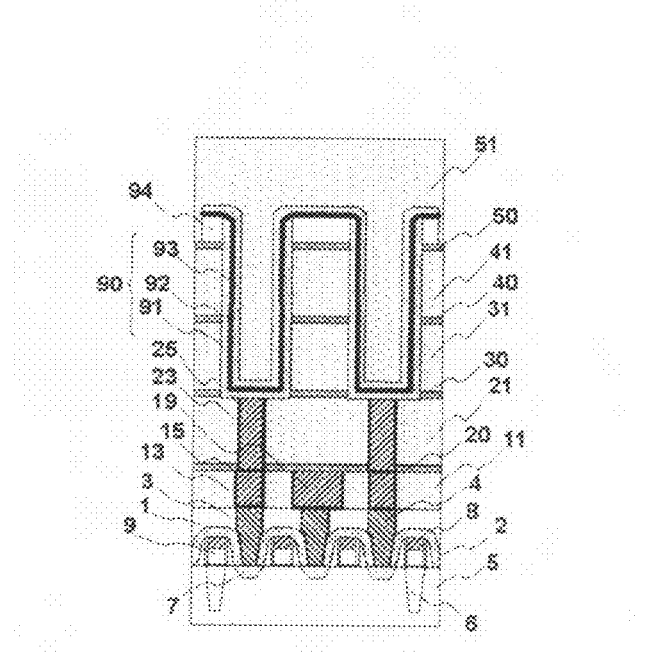
FIGS. 10A and 10B are sectional views showing procedures of manufacturing a semiconductor device in an example of the first embodiment of the present invention.
Figure 10B:
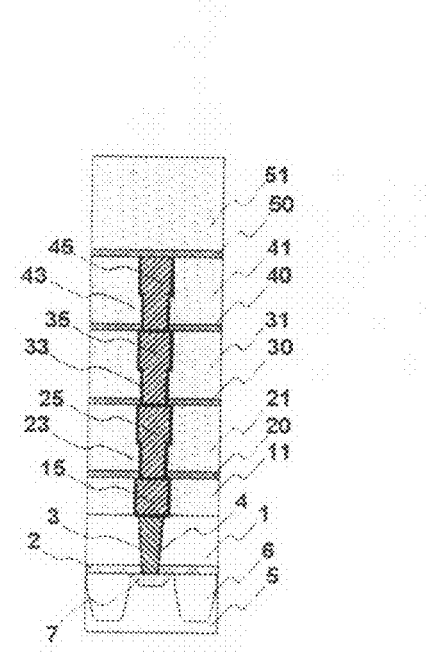
Figure 11A:
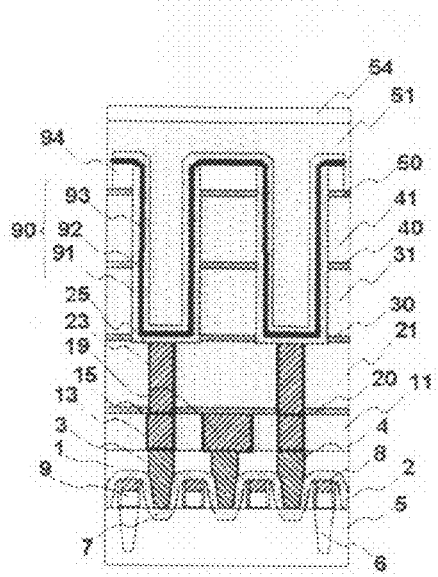
FIGS. 11A and 11B are sectional views showing procedures of manufacturing a semiconductor device in an example of the first embodiment of the present invention.
Figure 11B:
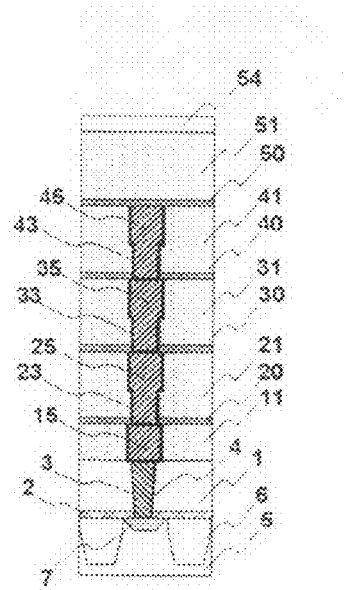

Then, the interlayer insulating layer 51 of the fifth layer is formed (FIGS. 10A and 10B). In this case, in the memory circuit portion, a level difference occurs between the memory circuit portion and the logic circuit portion due to the existence of the capacitive element 90. Accordingly, this is flattened by the technique, such as CMP. In addition, when it is difficult to embed an insulating layer in a cylinder opening, it is also possible to embed the capacitive element opening 98 using an interlayer insulating layer, which is excellent in being embedded, to perform etchback, to form the interlayer insulating layer only in the opening, and to form the interlayer insulating layer 51 of the fifth layer. Then, a hard mask insulating layer 54 that is used as a mask for forming the opening of the fifth layer wiring is formed (FIGS. 11A and 11B).

Figure 12A:
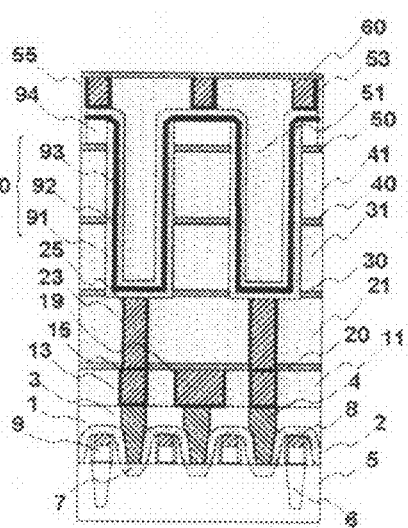
FIGS. 12A and 12B are sectional views showing procedures of manufacturing a semiconductor device in an example of the first embodiment of the present invention.
Figure 12B:
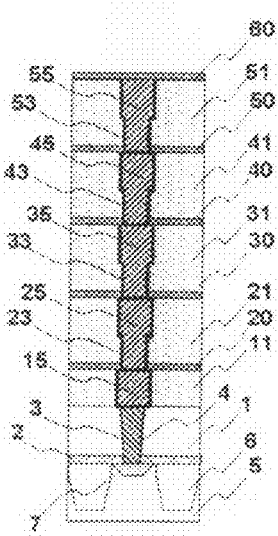

Then, the fifth layer wiring 55 is formed through the same process as in the method when the second layer wiring 25 is formed (FIGS. 12A and 12B). In addition, the cap layer 60 of the fifth layer wiring is formed after forming the fifth layer wiring (FIGS. 12A and 12B). In this case, in the memory circuit portion, the upper electrode functions as a stopper at the time of processing of a wiring groove and the depth of the groove is restricted. At the same time, an upper capacitor wiring (fifth layer wiring 55 formed in the memory circuit region) which is directly connected to the upper electrode is formed. As a result, a structure, in which the upper capacitor wiring as a plate line wiring is directly connected to the upper electrode, is acquired. In this structure, not only connection between capacitive elements as plate line wirings is made, but also the electric resistance between the elements can be reduced. In addition, the plate line wiring (fifth layer wiring 55 formed in the memory circuit region) is only shown to extend in the depth direction in FIG. 42A. In practice, however, the plate line wiring may be formed in the mesh shape in the plane within the memory circuit region (FIG. 43). Thus, in the first embodiment, the structure in which the plate line wiring is directly formed over the upper electrode is acquired. In addition, the sixth layer wiring 65 is similarly formed and then an upper wiring is formed, thereby completing the semiconductor integrated circuit (FIGS. 1A to 1C).

The effect of the first embodiment will be described. As described above, by embedding the capacitive element of the memory circuit portion in the multi-layered wiring structure and ensuring the height, which is equal to or more than a plurality of layers of the multi-layered wiring, in the structure of the capacitive element, it becomes easy to ensure the capacitance of the capacitive element without changing the structure of the multi-layered wiring even if it is miniaturized. Specifically, in the first embodiment, the case where the height of the capacitive element is larger than that of two layers of the logic circuit portion is shown. However, when the capacitance is insufficient due to the miniaturization, a structure higher than three layers may be formed by increasing one layer. In this case, it is not necessary to change the multi-layered wiring structure of the logic circuit portion.

Moreover, since the performance of the logic circuit portion is emphasized in the first embodiment, it is preferable that all wirings of a wiring layer at least in a region where a capacitive element is formed are formed of a wiring material containing copper as a main component in order to reduce the wiring resistance. More preferably, all wirings of the wiring layer are formed of a wiring material containing copper as a main component. As described above, the copper may include a metal additive, such as aluminum or silver.

In order to reduce the wiring resistance, at least wiring materials used for the multi-layered wirings (second layer wiring 25, third layer wiring 35, and fourth layer wiring 45) in which a capacitive element is embedded are preferably copper. More preferably, copper wirings are used for all wiring layers (first to sixth wiring layers) (however, a so-called pad Al layer is excluded). In the first embodiment, copper wirings are used for all wiring layers from the first layer wiring 15 to the sixth layer wiring 65, as shown in FIGS. 1A to 1C. In the design of a logic circuit portion of a so-called memory composite LSI, in which a memory circuit portion and a logic circuit portion are integrated over the same semiconductor substrate, like the first embodiment, it is possible to use the same parameters as in the design of the normal logic LSI in which a memory circuit portion is not provided together with a logic circuit portion. Accordingly, the design just for the logic circuit portion of the LSI in which the memory circuit portion is provided together becomes unnecessary.

Thus, according to the first embodiment, in a semiconductor integrated circuit device which includes a memory circuit portion provided with a capacitive element and a logic circuit portion over the same semiconductor substrate, all wirings required for connection of the capacitive element can be formed using multi-layered wirings of the logic circuit portion by embedding the capacitive element in a region ranging at least over a plurality of wiring layers of an interlayer insulating layer which separates multi-layered wirings formed in the logic circuit portion by insulation. Accordingly, also in the case where a memory circuit and a logic circuit are formed over the same semiconductor substrate, the design parameters of the logic circuit at the time of design can be used as compatible values regardless of the existence of a capacitive element. As a result, also in an integrated circuit in which a capacitive element is formed over the same substrate, the design becomes easy.

In addition, since the height of a capacitive element is ensured by disposing the capacitive element over a plurality of layers of a multi-layered wiring, the required capacitance can be ensured even if the scaling progresses. In addition, since the distance from a diffusion layer of a transistor in a logic circuit portion to the first wiring layer is significantly reduced compared with that in the related art, the formation becomes easy. Moreover, since the parasitic capacitance of the transistor is reduced by decreasing the resistance, a high-speed operation becomes possible.

In addition, a Low-k/Cu wiring which has low resistance and low parasitic capacitance can be applied to both the memory circuit portion and the logic circuit portion. Accordingly, the performance of the logic circuit portion does not deteriorate at all even if the memory circuit portion with a capacitive element is provided together.

In addition, neither a dedicated process nor a dedicated facility for forming a wiring, which is called a plate line for connection between upper electrodes, is needed by connecting upper electrodes of capacitive elements to each other with an upper capacitor wiring formed at the same height as a wiring existing in a logic circuit portion, the thicknesses of upper and lower layers of the capacitive element can be ensured and the aspect of a contact (logic contact) of the logic circuit portion can be reduced. In addition, the same effect is acquired even if the lower capacitor wiring is provided such that the upper surface of the lower capacitor wiring and the upper surface of the wiring of a wiring layer provided with the lower capacitor wiring are coplanar. In addition, by providing a silicon oxide layer partially in a lower portion of a capacitor insulating layer other than an opening of a capacitive element, it is possible to protect a cap layer, which exists at a lower layer of the silicon oxide layer in a logic circuit portion, during the forming of the capacitive element and also to protect a copper wiring and an interlayer insulating layer located below the cap layer. Through the existence of the silicon oxide layer, an increase in resistance or a drop in reliability caused by oxidation of the copper wiring of the logic circuit portion, oxidizing can be prevented. Accordingly, it is possible to suppress performance degradation or malfunction in the logic circuit portion.

Figure 32A:
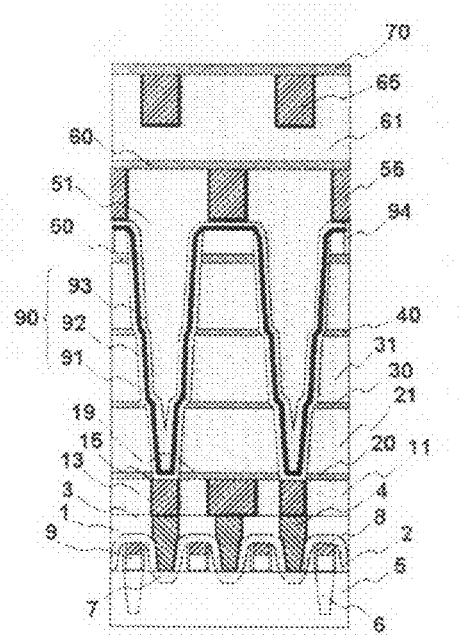
FIGS. 32A and 32B are sectional views showing a semiconductor device in an example of the seventh embodiment of the present invention.
Figure 32B:
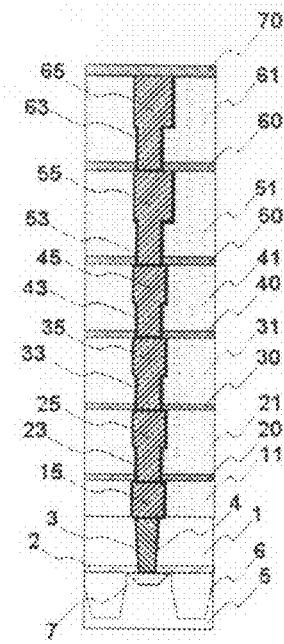

As described in the first embodiment, it is effective to form the capacitive element in the multi-layered wiring layer located at the lower layer which is being most miniaturized. In general, the thicknesses of wirings and wiring layers which form the multi-layered wiring layer located at the lower layer are equal. This is because the characteristics of wirings become equal in the respective layers and accordingly, the circuit design at the side of a logic circuit provided together becomes easy. However, the main point of the first embodiment is that a capacitive element is embedded in a multi-layered wiring layer including at least two or more layers. Accordingly, the thicknesses of the wiring layers or wirings do not need to be necessarily equal. As a modification of the first embodiment, for example, as shown in FIGS. 32A and 32B which will be described later, a part of upper portion of a capacitive element may be formed in an upper multi-layered wiring layer (global wiring) located over a multi-layered wiring located in a lower layer. In general, the thickness of each wiring layer or wiring which forms the upper multi-layered wiring layer is larger than that of a multi-layered wiring layer located at the lower layer.

Those disclosed in Japanese Unexamined Patent Publication NO. 2004-342787 are shown like FIGS. 33A and 33B. In FIGS. 33A and 33B, reference numeral 111 denotes a lift-up insulating layer A, reference numeral 112 denotes a lift-up wiring plug A, reference numeral 113 denotes a capacitor processing stop layer, reference numeral 114 denotes a lift-up insulating layer B, reference numeral 115 denotes a lift-up wiring plug B, reference numeral 116 denotes a wiring processing stop layer, and reference numeral 117 denotes a plate line. In Japanese Unexamined Patent Publication NO. 2004-342787, the memory circuit portion 101 has a structure (add-on structure) in which the multi-layered wiring portion 103 is provided over the capacitive element 90. Accordingly, in the logic circuit portion 102, a wiring portion (lift-up wiring portion 104) for lifting up the multi-layered wiring portion 103 according to the height of the capacitive element 90 was needed. The lift-up wiring portion 104 is difficult to be formed because the aspect ratio is high, and the resistance is high. Due to the existence of the lift-up wiring portion 104, the design parameters of the add-on logic circuit portion 102 become largely different from those in the case where the lift-up wiring portion 104 does not exist, and the performance of the add-on logic circuit portion 102 deteriorates. These conditions become worse as the miniaturization progresses.

On the other hand, in the first embodiment, a memory circuit portion 105 and a logic circuit portion 106 with built-in structures shown in FIGS. 33C and 33D, in which the capacitive element 90 is embedded in the multi-layered wiring structure, are provided for the structures of the memory circuit portion and logic circuit portion. Accordingly, by changing the number of layers passing through the multi-layered wiring regarding the height of the capacitive element, it is possible to ensure the capacitance. Moreover, in the case of the built-in logic circuit portion 106, there is no change of design parameters caused by the existence of the capacitive element 90. That is, since there is no change in the structure and material of the multi-layered wiring of the logic circuit portion even if the built-in memory circuit portion 105 exists over the same semiconductor substrate, it is possible to use design parameters which are completely compatible with those in the case where only a logic circuit portion exists. In other words, in a composite circuit chip which includes a memory circuit portion with a capacitive element and a logic circuit portion, a high-speed memory function can be realized while maintaining the logic operation capability which is completely the same as that of a logic circuit chip including only a normal logic circuit portion.

Figures 13A, 13B, 13C:
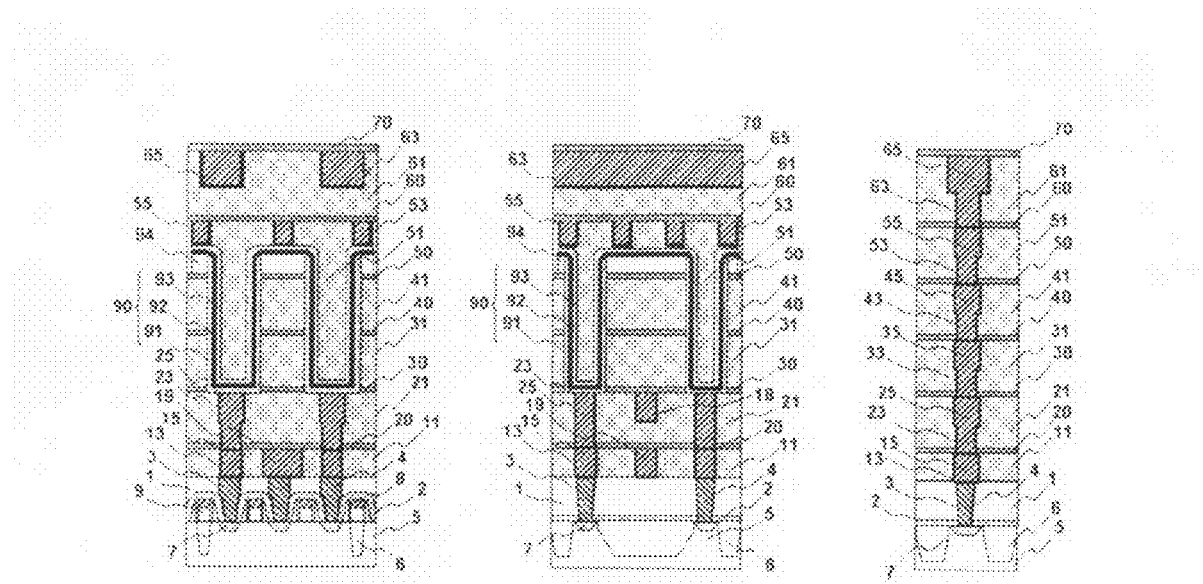
FIGS. 13A to 13C are sectional views showing a semiconductor device in an example of the first embodiment of the present invention.

Moreover, as described above, in the first embodiment, the MPS layer is used as the interlayer insulating layer and the SCC layer is used as the cap layer. However, as shown in FIGS. 13A to 13C, a SiOCH layer, such as Black Diamond™, may be adopted as the interlayer insulating layer and a SiCN layer may be adopted as the cap layer. In this case, since the composition of the layers is different due to the existence of nitrogen, the processing is conditions need to be set in consideration of the point when forming the opening of the capacitive element 90.

Figures 14A, 14B, 14C:
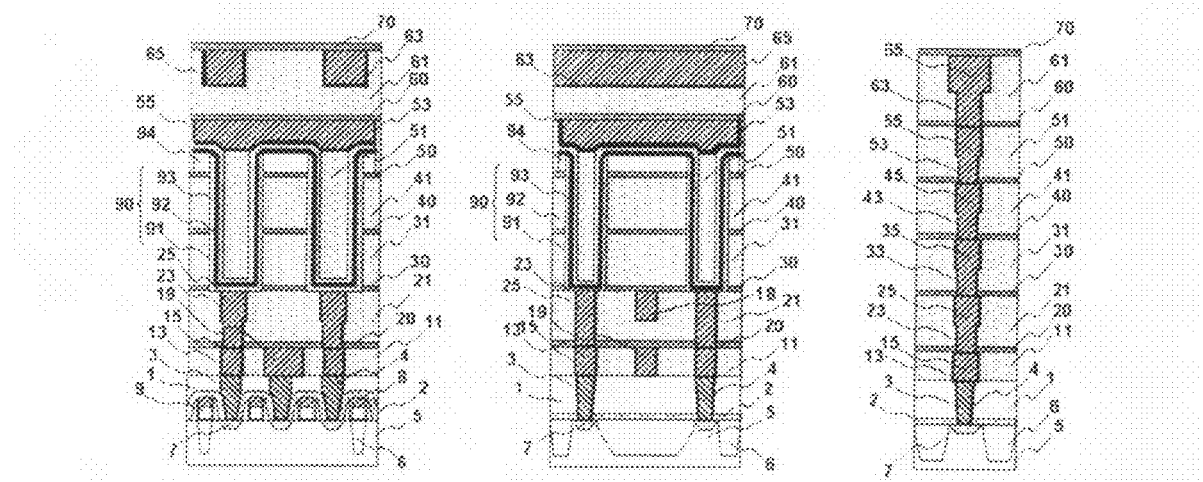
FIGS. 14A to 14C are sectional views showing a semiconductor device in an example of the first embodiment of the present invention.

Alternatively, as shown in FIGS. 14A to 14C, a plate line wiring (fifth layer wiring 55 formed in the memory circuit region) may be formed in the shape over a pad, which is not the wiring shape, in the memory circuit region. That is, the plate line wiring may be an ultra-wide wiring. In addition, the plate line wiring may be formed in the wide wiring shape with slits interposed in places.

Second Embodiment

Figure 15A:
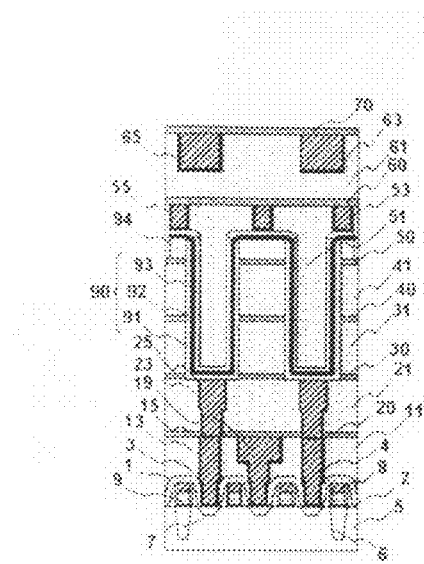
FIGS. 15A to 15C are sectional views showing a semiconductor device in an example of a second embodiment of the present invention.
Figure 15B:
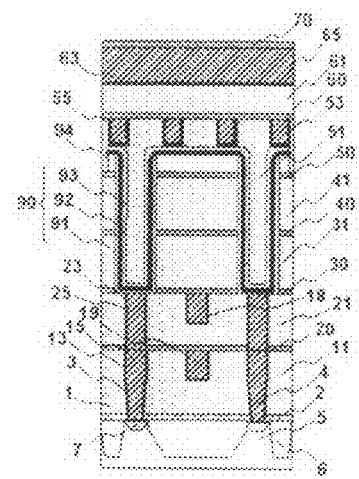
Figure 15C:
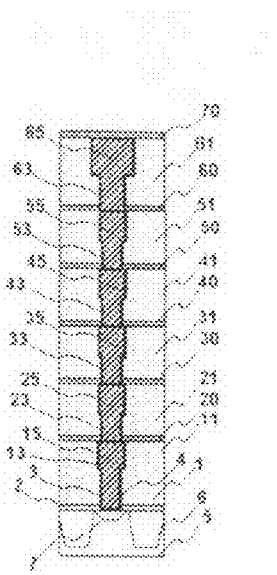

FIGS. 15A to 15C are sectional views showing a semiconductor device according to a second embodiment of the present invention. FIGS. 15A and 15B at the left and middle sides are sectional views of a memory circuit region, and are sectional views rotated by 90° from each other. In addition, FIG. 15C at the right side shows a typical sectional view of a logic circuit region.

Based on the structure of the first embodiment, copper is adopted for a contact plug 4, and a first layer wiring 15 and the dual damascene shape (dual damascene contact shape) are formed. Accordingly, it is possible to realize the structure in which the resistance from a diffusion layer to the first layer wiring 15 is further reduced. In this case, although a silicon oxide layer may be used as the insulating layer 1 between contact layers like FIGS. 2A and 2B, the insulating layer 1 between contact layers is the same interlayer insulating layer as the first layer wiring 15 herein. Alternatively, a low dielectric constant SiOCH layer which is different from the first layer may be used as the insulating layer 1 between contact layers. Moreover, a laminated structure of different low dielectric constant SiOCH layers may be adopted. For the insulating layer 1 between contact layers, it is preferable to use a layer with Cu diffusion barrier resistance, for example, the SCC layer. When a laminated structure is used, it is preferable to use it in a lowermost layer, that is, right above an etch stop layer.

In particular, the SCC layer is formed by the plasma polymerization method. Accordingly, the SCC layer is excellent for step coverage rather than the interlayer insulating layer formed by the normal plasma CVD method. For this reason, when the SCC layer is formed over the uneven surface, which is formed due to the existence of a gate, like the semiconductor substrate after the forming of the etch stop layer, the SCC layer can be satisfactorily embedded.

In addition, in the second embodiment, copper is also adopted as a material for the contact plug 4, and copper is used for all plugs including the contact plug 4 and all wiring metals including via (except for a so-called pad Al layer). This is one of the most preferable forms since low resistance is realized.

Moreover, in the structure of the second embodiment, a contact barrier metal layer 3 of the contact plug 4 also serves as a barrier metal layer 13 of the first layer wiring 15 and is formed in the dual damascene process as described above. Accordingly, the contact barrier metal layer 3 is preferably a barrier layer which is high in resistance to copper diffusion and has a low resistance. Among metal layers used for the barrier metal, tantalum nitride or a laminated structure of tantalum/tantalum nitride is preferable, and a laminated structure of ruthenium/titanium is more preferable.

Third Embodiment

Figure 16A:
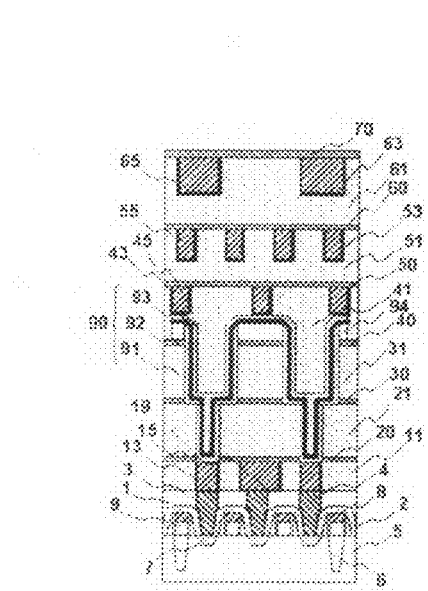
FIGS. 16A to 16C are sectional views showing a semiconductor device in an example of a third embodiment of the present invention.
Figure 16B:
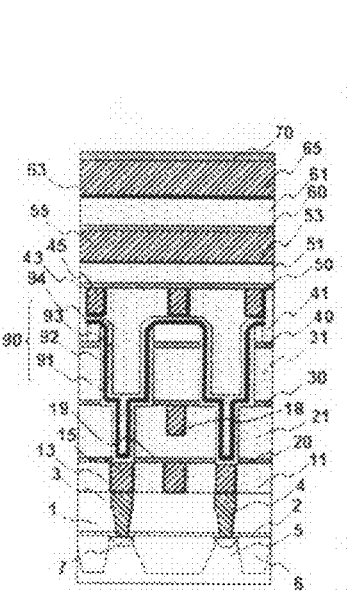
Figure 16C:
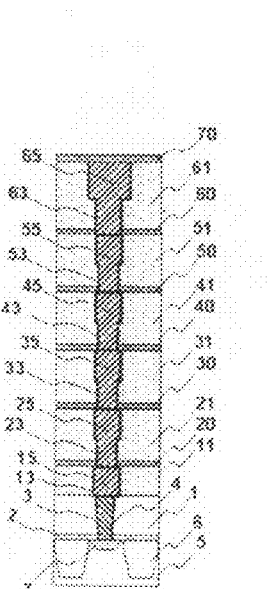

FIGS. 16A to 16C are sectional views showing a semiconductor device according to a third embodiment of the present invention.

FIGS. 17A to 25B are examples of sectional views showing procedures of manufacturing the semiconductor device in FIGS. 16A to 16C. FIGS. 16A and 16B at the left and middle sides are sectional views of a memory circuit region, and show cross sections rotated by 90° from each other. In addition, FIG. 16C at the right side shows a typical sectional view of a logic circuit region. FIGS. 17A, 18A, 19A, 20A, 21A, 22A, 23A, 24A, and 25A at the left side show typical sectional views of memory circuit regions, and FIGS. 17B, 18B, 19B, 20B, 21B, 22B, 23B, 24B, and 25B at the right side show typical sectional views of logic circuit regions.

Figure 17A:
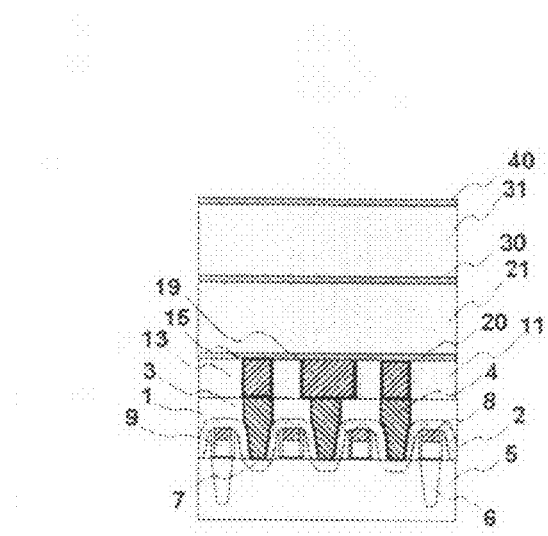
FIGS. 17A and 17B are sectional views showing procedures of manufacturing a semiconductor device in an example of the third embodiment of the present invention.
Figure 17B:
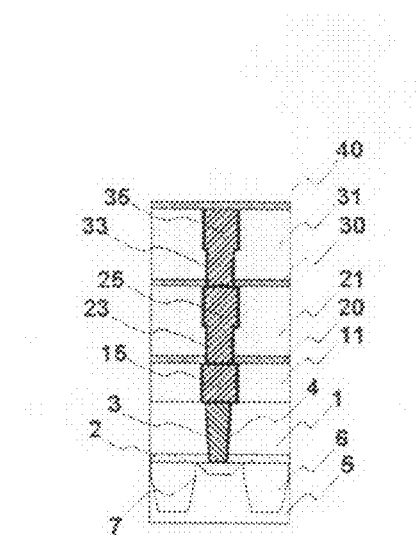

In the same manner as in the first embodiment, a substrate with a structure after formation of a MOS transistor 9 and a third layer wiring 35, which has been generated by using a typical method of forming an integrated circuit, is shown in FIGS. 17A and 17B. Here, a second layer wiring 25 and a third layer wiring 35 are formed only in the logic circuit region since a capacitive element is formed in the memory circuit region later. In the third embodiment, the case where the height of the capacitive element is smaller than that of three layers of the logic circuit portion is shown. However, when the height of the capacitive element is set to be higher than that of three layers of the logic circuit portion, one more layer is formed for the logic circuit portion.

Moreover, in FIGS. 17A and 17B, reference numeral 1 denotes an insulating layer between contact layers, reference numeral 2 denotes an etch stop layer, reference numeral 3 denotes a contact barrier metal layer, reference numeral 4 denotes a contact plug, reference numeral 5 denotes a silicon (Si) substrate, reference numeral 6 denotes an element separation shallow trench isolation (STI), reference numeral 7 denotes a diffusion layer, and reference numeral 8 denotes a gate electrode.

In addition, reference numeral 11 denotes an interlayer insulating layer of a first layer, reference numeral 13 denotes a first layer wiring barrier metal layer, reference numeral 15 denotes a first layer wiring, reference numeral 20 denotes a cap layer of a first layer wiring, reference numeral 23 denotes a second layer wiring barrier metal layer, reference numeral 25 denotes a second layer wiring, and reference numeral 30 denotes a cap layer of a second layer wiring. In addition, a bit line 19 is formed simultaneously with the first layer wiring 15 and serves as a bit line in a memory circuit portion.

In addition, since the bit line 19 is formed in the same layer as the first layer wiring 15, a wiring layer with only bit lines which is found in Japanese Unexamined Patent Publication NO. 2004-342787 or the like does not exist. Moreover, in the third embodiment, a lower electrode wiring which is electrically connected to a lower electrode of a capacitive element, what is called a lower electrode wiring which performs lower electrode contact, is formed in the first layer wiring 15 of the same layer as the bit line 19. Through the structure shown in the third embodiment, the number of layers can be effectively utilized in the multi-layered wiring structure.

In FIGS. 17A and 17B, the insulating layer 1 between contact layers is a silicon oxide layer, the contact plug 4 is formed of tungsten, and the contact barrier metal layer 3 is a laminated layer of titanium nitride/titanium. In addition, the interlayer insulating layer 11 of the first layer and the interlayer insulating layer 21 of the second layer are low dielectric constant insulating layers and are SiOCH layers, more specifically, MPS layers. The first layer wiring barrier metal layer 13 is a laminated layer of tantalum/tantalum nitride, and the first layer wiring 15 is formed of copper. In addition, the cap layer 20 of the first layer wiring and the cap layer 30 of the second layer wiring are SCC layers. In addition, details of the SCC layer are also disclosed in M. Ueki et al., IEEE IEDM, pp 973-976 (2007), like the MPS layer. The SCC layer is a kind of SiOCH layer and has resistance to copper diffusion. The method of forming the second layer wiring 25 and the third layer wiring 35 is the same as that in the first embodiment.

Also in the third embodiment, an insulating layer with a single layer is used as the interlayer insulating layer and the cap layer. However, a laminated structure of a plurality of kinds of insulating layers may also be used as the interlayer insulating layer and the cap layer, like the first embodiment. For example, a laminated structure of an MPS layer and a SiOCH layer may be used as the interlayer insulating layer, and a laminated structure of a SiC layer and a SiCN layer may be used as the cap layer.

Here, a wiring layer is formed only in the logic circuit region since a capacitive element is formed in the memory circuit region later. In the third embodiment, the case where the height of the capacitive element is smaller than that of three layers of the logic circuit portion is shown. However, when the height of the capacitive element is set to be higher than that of three layers of the logic circuit portion, one more layer is formed for the logic circuit portion.

Figure 18A:
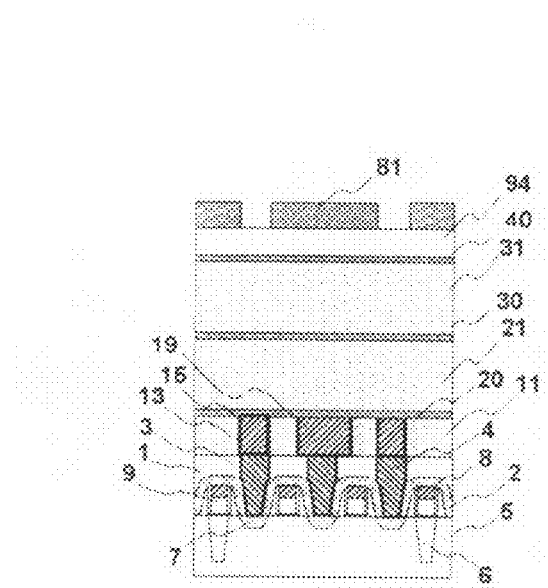
FIGS. 18A and 18B are sectional views showing procedures of manufacturing a semiconductor device in an example of the third embodiment of the present invention.
Figure 18B:
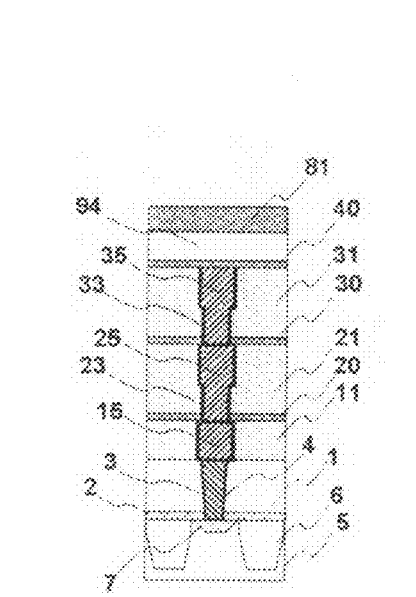

Then, a cap layer 40 of the third layer wiring is deposited as shown in FIGS. 18A and 18B, and then a hard mask insulating layer 94 is formed. Then, a cylinder processing resist layer A 81 is formed by lithography.

Here, a silicon oxide layer is used as the hard mask insulating layer 94. However, a laminated structure including another insulating layer may also be used as the hard mask insulating layer 94. In addition, it is also possible to adopt a multi-layered structure in which an antireflection layer is provided between the hard mask insulating layer 94 and a resist layer. In any case, it is preferable that the hard mask insulating layer 94 is an insulating layer with an effect of protecting the cap layer 50 of the fourth layer wiring in the process of forming a capacitive element. Specifically, a silicon nitride layer, a silicon oxynitride layer, and the like may be mentioned in addition to the silicon oxide layer.

Figure 19A:
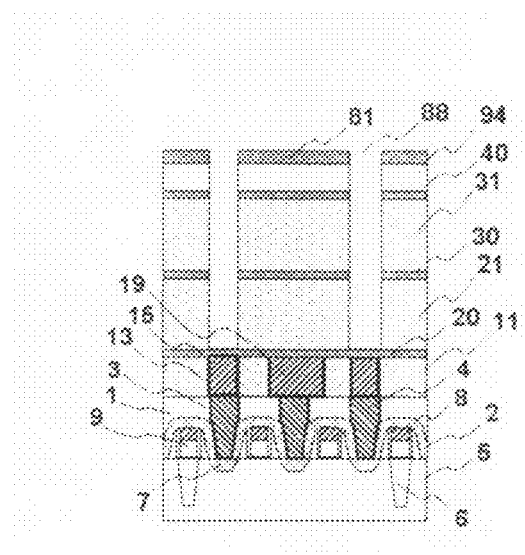
FIGS. 19A and 19B are sectional views showing procedures of manufacturing a semiconductor device in an example of the third embodiment of the present invention.
Figure 19B:
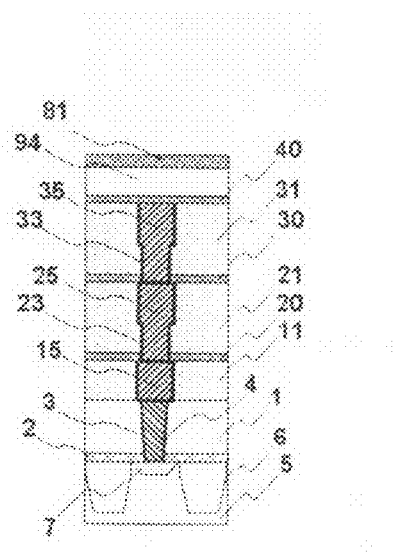

Then, as shown in FIGS. 19A and 19B, a capacitive element opening A 88 is formed by dry etching. In this case, the cap layer 20 of the first layer wiring is not etched in order to prevent oxidation of the first layer wiring 15.

When forming the capacitive element opening A 88, the interlayer insulating layer and the cap layer are alternately etched by dry etching. In the third embodiment, an MPS layer is used as the interlayer insulating layer and an SCC layer is used as the cap layer like the first embodiment, and a structure in which a SiOCH layer is laminated is used. Accordingly, the satisfactory shape of the capacitive element opening A 88 can be acquired by study of the processing.

Figure 20A:
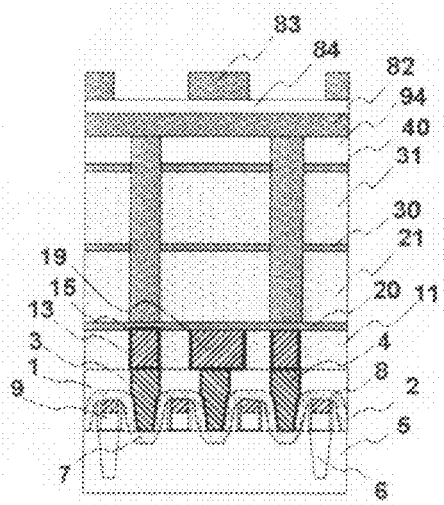
FIGS. 20A and 20B are sectional views showing procedures of manufacturing a semiconductor device in an example of the third embodiment of the present invention.
Figure 20B:
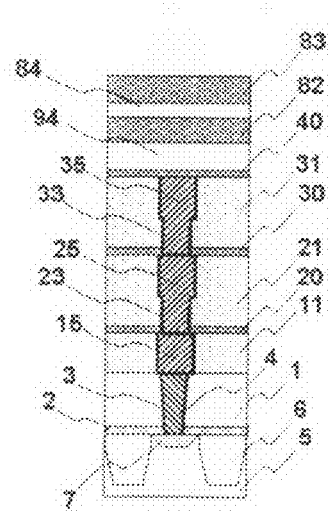
Figure 21A:
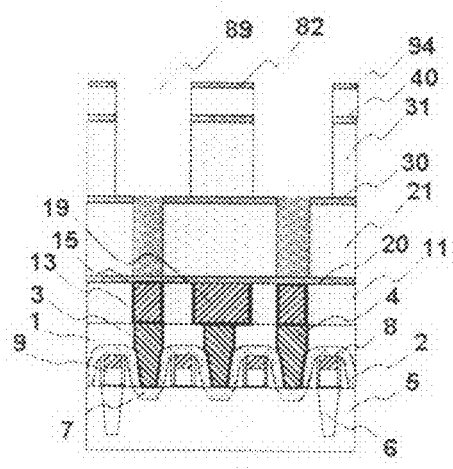
FIGS. 21A and 21B are sectional views showing procedures of manufacturing a semiconductor device in an example of the third embodiment of the present invention.
Figure 21B:
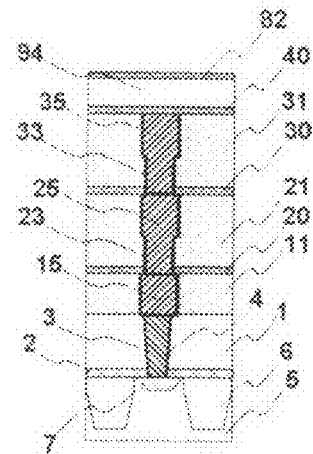
Figure 22A:
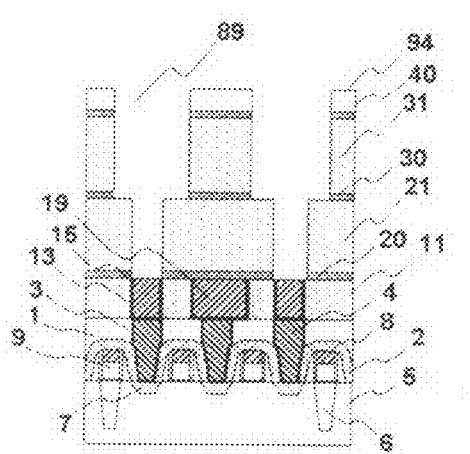
FIGS. 22A and 22B are sectional views showing procedures of manufacturing a semiconductor device in an example of the third embodiment of the present invention.
Figure 22B:
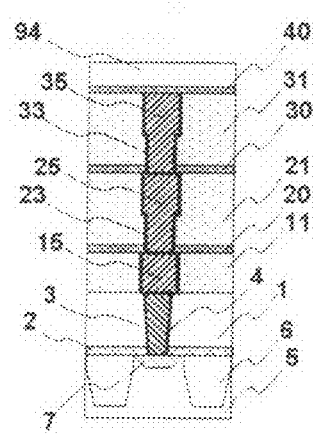

Then, a cylinder processing resist layer B 82 and a cylinder processing mask insulating layer 84 are formed after removing the cylinder processing resist layer A 81 by ashing, and a cylinder processing resist layer C 83 is formed by lithography (FIGS. 20A and 20B). Using dry etching again, a capacitive element opening B 89 is formed (FIGS. 21A and 21B). Then, the cylinder processing resist layer B 82 is removed by ashing, and then the cap layer 20 of the first layer wiring is etched back in order to connect a lower electrode of the capacitive element to the first layer wiring 15 serving as a wiring of a lower layer (FIGS. 22A and 22B).

Figure 23A:
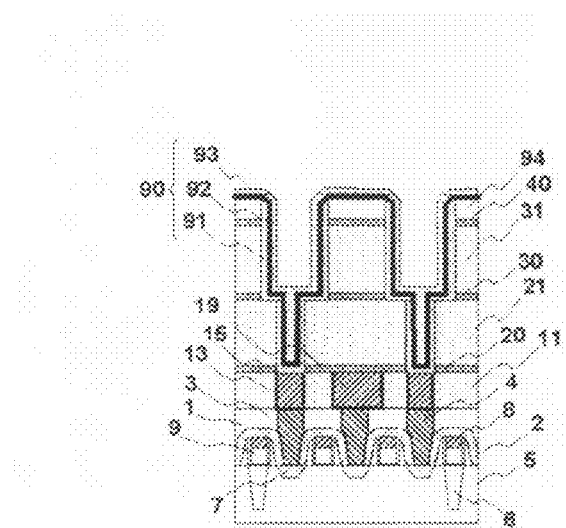
FIGS. 23A and 23B are sectional views showing procedures of manufacturing a semiconductor device in an example of the third embodiment of the present invention.
Figure 23B:
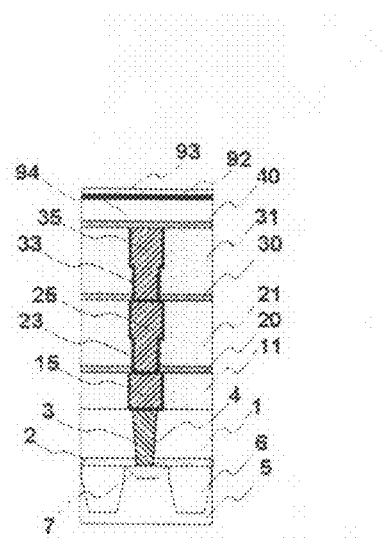
Figure 24A:
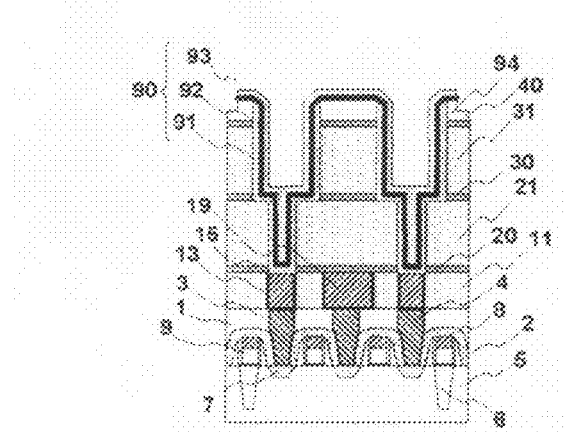
FIGS. 24A and 24B are sectional views showing procedures of manufacturing a semiconductor device in an example of the third embodiment of the present invention.
Figure 24B:
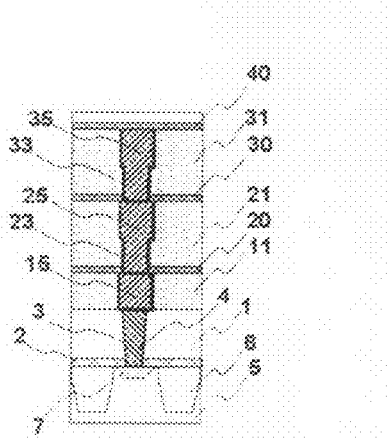

Then, in the same manner as in the first embodiment, a lower electrode layer 91 serving as a lower electrode of a capacitive element is formed and the lower electrode layer 91 is formed only in the inside of the capacitive element by lithography. Then, a capacitor insulating layer 92 and an upper electrode layer 93 are formed (FIGS. 23A and 23B). The capacitor insulating layer 92 and the upper electrode layer 93 are processed in the same manner as in the first embodiment (FIGS. 24A and 24B).

Then, the hard mask insulating layer 94 is etched back using the upper electrode as a mask, such that the cap layer 40 of the third layer wiring is exposed (not shown in the drawings). As a result, the hard mask insulating layer 94 remains only in a region where the capacitor layer and the upper electrode exist.

Then, an interlayer insulating layer 41 of a fourth layer is formed (FIGS. 25A and 25B). In the subsequent process, the interlayer insulating layer 41 of the fourth layer is made to be flat and a fourth layer wiring 45 is formed through the same process as in the first embodiment. Then, an upper layer wiring is further formed by forming a fifth layer wiring 55 serving as the upper layer wiring (FIGS. 16A to 16C), thereby completing the semiconductor integrated circuit.

In the third embodiment, since the bit line 19 is formed in the same layer as the first layer wiring 15 like the first or second embodiment, a wiring layer with only bit lines which is found in Japanese Unexamined Patent Publication NO. 2004-342787 or the like does not exist. Moreover, in the third embodiment, a wiring which is electrically connected to a lower electrode of a capacitive element, what is called a wiring which performs lower electrode contact, is formed in the first layer wiring 15 of the same layer as the bit line 19. Through the structure shown in the third embodiment, the number of layers can be effectively utilized in the multi-layered wiring structure. In addition, the capacitive element is formed to pass through a layer of the second layer wiring 25 and a layer of the third layer wiring 35. Moreover, regarding the connection to a lower electrode, the shape in which cylinders with different diameters are connected up and down is adopted in order to directly connect the capacitive element to the first layer wiring 15. This shape is a suitable structure for directly connecting the capacitive element to the first layer wiring 15 for the connection of the capacitive element to the lower electrode. Accordingly, the structure of the capacitive element in the third embodiment becomes a shape in which the cylinders with different diameters are connected to each other.

As described above, in the third embodiment, the MPS layer is used as the interlayer insulating layer and the SCC layer is used as the cap layer. However, as shown in FIGS. 26A to 26C, a SiOCH layer, such as Black Diamond™, may be adopted as the interlayer insulating layer and a SiCN layer may be adopted as the cap layer. In this case, since the composition of the layers is different due to the existence of nitrogen, the processing conditions need to be set in consideration of the point when forming the opening of a capacitive element.

Fourth Embodiment

Figures 27A, 27B, 27C, 28A, 28B, 28C:
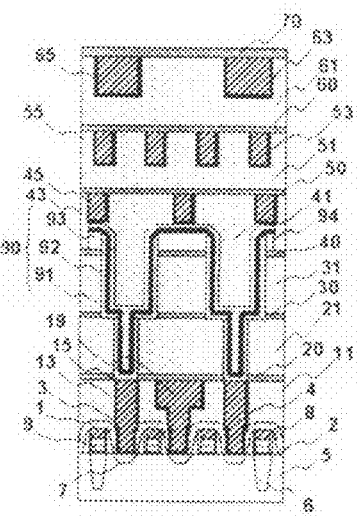
FIGS. 27A to 27C are sectional views showing a semiconductor device in an example of a fourth embodiment of the present invention.
FIGS. 28A to 28C are sectional views showing a semiconductor device in an example of a fifth embodiment of the present invention.

FIGS. 27A to 27C are sectional views showing a semiconductor device according to a fourth embodiment of the present invention. FIGS. 27A and 27B at the left and middle sides are sectional views of a memory circuit region, and are sectional views rotated by 90° from each other. In addition, FIG. 27C at the right side shows a typical sectional view of a logic circuit region.

Based on the structure of the third embodiment, copper is adopted for a contact plug 4, and a first layer wiring and the dual damascene shape (dual damascene contact shape) are formed. Accordingly, it is possible to realize the structure in which the resistance from a diffusion layer to the first layer wiring 15 is further reduced. In this case, although a silicon oxide layer may be used as the insulating layer 1 between contact layers like FIGS. 2A and 2B, the insulating layer 1 between contact layers is the same interlayer insulating layer as the first layer wiring 15 herein. Alternatively, a low dielectric constant SiOCH layer which is different from the first layer may be used as the insulating layer 1 between contact layers. Moreover, a laminated structure of different low dielectric constant SiOCH layers may be adopted. For the insulating layer between contact layers, it is preferable to use a layer with Cu diffusion barrier resistance, for example, the SCC layer. When a laminated structure is used, it is preferable to use it in a lowermost layer, that is, right above an etch stop layer.

Moreover, in the semiconductor device according to the fourth embodiment, a lower capacitor wiring (first layer wiring 15) connected to a lower electrode (lower electrode layer 91) is connected to the contact plug 4, which is connected to a diffusion layer 7 formed near the surface of the semiconductor substrate (silicon substrate 5), and a signal wiring (bit line 19) which connects between semiconductor elements (MOS transistors 9) is formed in the same layer as the lower capacitor wiring (first layer wiring 15).

In particular, the SCC layer is formed by the plasma polymerization method. Accordingly, the SCC layer is excellent for step coverage rather than the interlayer insulating layer formed by the normal plasma CVD method. For this reason, when the SCC layer is formed over the uneven surface, which is formed due to the existence of a gate, like the semiconductor substrate after the forming of the etch stop layer, the SCC layer can be satisfactorily embedded.

Moreover, in the structure of the fourth embodiment, a contact barrier metal layer 3 of the contact plug 4 also serves as a barrier metal layer 13 of the first layer wiring 15 and is formed in the dual damascene process as described above. Accordingly, the contact barrier metal layer 3 is preferably a barrier layer which is high in resistance to copper diffusion and has a low resistance. Among metal layers used for the barrier metal, tantalum nitride or a laminated structure of tantalum/tantalum nitride is preferable, and a laminated structure of ruthenium/titanium is more preferable.

Fifth Embodiment

FIGS. 28A to 28C are sectional views showing a semiconductor device according to a fifth embodiment of the present invention. FIGS. 28A and 28B at the left and middle sides are sectional views of a memory circuit region, and are sectional views rotated by 90° from each other. In addition, FIG. 28C at the right side shows a typical sectional view of a logic circuit region.

In FIGS. 19A and 19B, when forming a capacitive element opening A 88 after forming a cylinder processing resist layer A 81, the capacitive element opening A 88 may be formed in the tapered shape by increasing isotropic components by controlling the anisotropy in the dry etching conditions. By executing the same processes as those from FIGS. 23A and 23B after forming the capacitive element opening A 88 in the tapered shape, a structure shown in FIGS. 28A to 28C is formed. By the method used in the fifth embodiment, the lithography process and reticle for forming the capacitive element opening B 89 become unnecessary. As a result, the manufacturing cost can be reduced.

Also in the fifth embodiment, the capacitive element is formed to pass through a layer of the second layer wiring 25 and a layer of the third layer wiring 35. In addition, regarding the connection to a lower electrode, the shape in which tapered cylinders with different diameters are connected up and down is adopted in order to directly connect the capacitive element to the first layer wiring 15. This shape is a suitable structure for directly connecting the capacitive element to the first layer wiring 15 for the connection of the capacitive element to the lower electrode, like the third or fourth embodiment.

Sixth Embodiment

Figures 29A, 29B, 29C, 30A, 30B, 30C:
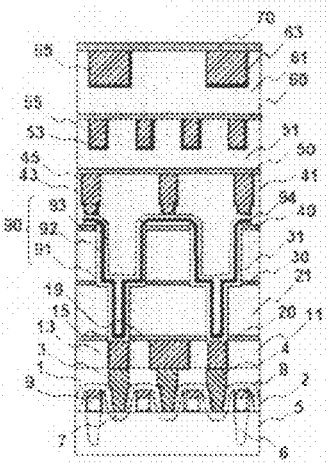
FIGS. 29A to 29C are sectional views showing a semiconductor device in an example of a sixth embodiment of the present invention.
FIGS. 30A to 30C are sectional views showing a semiconductor device in an example of a seventh embodiment of the present invention.

FIGS. 29A to 29C are sectional views showing a semiconductor device according to a sixth embodiment of the present invention. FIGS. 29A and 29B at the left and middle sides are sectional views of a memory circuit region, and are sectional views rotated by 90° from each other. In addition, FIG. 29C at the right side shows a typical sectional view of a logic circuit region.

In FIGS. 18A and 18B, the cap layer 40 of the third layer wiring is deposited and then the hard mask insulating layer 94 is formed.

In this case, the hard mask insulating layer 94 is a thin layer with a thickness equal to or more than about 20 nm and equal to or less than about 30 nm. In addition, the process of forming the cylinder processing resist layer A 81 by lithography and subsequent processes are performed like the third embodiment. When etching back the cap layer 20 of the first layer wiring located at the bottom of the cylinder opening A, the hard mask insulating layer 94 is also etched simultaneously. As a result, the thickness of the hard mask insulating layer 94 decreases to about 10 nm or more and about 20 nm or less. Then, a lower electrode layer is formed like the third embodiment, and the lower electrode is etched back after lithography. In this case, the thickness of the hard mask insulating layer 94 is further decreased by over-etching. As a result, the thickness of the hard mask insulating layer 94 becomes about 10 nm or less than 10 nm. Then, when processing the capacitor insulating layer 92 and the upper electrode layer 93 after forming the layers, the hard mask insulating layer 94 in a region where there is no work electrode is almost removed. Accordingly, the etchback process described in the third embodiment becomes unnecessary. The subsequent process of forming the upper wiring is performed in the same manner as in the third embodiment.

In the structure of the sixth embodiment, however, the distance from the bottom surface (surface of the fourth layer wiring 45) of the cap layer 50 of the fourth layer wiring to the surface of the upper electrode layer 93 is shorter than the via height of the fourth layer wiring 45. Therefore, it is necessary to expose a via pattern since a via below the fourth layer wiring 45 also needs to be formed in the memory circuit region. However, since the exposure in this case is performed simultaneously with exposure of the via pattern of the fourth layer wiring 45, there is neither an increase in the number of reticules nor an increase in the number of processes.

Through the above-described method, the structure shown in FIGS. 29A to 29C is formed.

In the sixth embodiment, a connection via is further provided between the upper electrode and the upper capacitor wiring in the structures of the first to fifth embodiments. In the structures of the first to fifth embodiments, the depth of a wiring groove directly formed over an upper electrode of a capacitive element should be smaller than that of a wiring groove of a logic circuit portion in the same layer with the same surface. On the other hand, such restriction is eliminated by adopting the structure of connecting the upper capacitor wiring to the upper electrode of the capacitive element through a via like the sixth embodiment. As a result, the degree of freedom in design of the wiring structure is improved. In other words, if the wiring structure is limited to the structure in which the wiring groove is directly formed over the upper electrode of the capacitive element, the depth of the wiring groove in the logic circuit portion is restricted depending on the structure of the capacitive element.

In the sixth embodiment, the capacitive element is formed to pass through the second and third layers. For example, if the capacitive element is formed to pass through both a local wiring layer and a semi-global wiring layer, the via height of the semi-global wiring layer is increased. Accordingly, the thickness of the hard mask insulating layer 94 can be more reduced in the sixth embodiment than in the structure in which the plate line wiring is directly formed over the upper electrode like the first embodiment. Particularly when the low dielectric constant SiOCH layer is also used as an interlayer insulating layer of the semi-global layer, it is possible to reduce the effective dielectric constant of the interlayer insulating layer.

Seventh Embodiment

FIGS. 30A to 31B are sectional views showing a semiconductor device according to a seventh embodiment of the present invention. FIGS. 30A and 30B at the left and middle sides are sectional views of a memory circuit region, and are sectional views rotated by 90° from each other. In addition, FIG. 30C at the right side shows a typical sectional view of a logic circuit region.

Figure 31A:
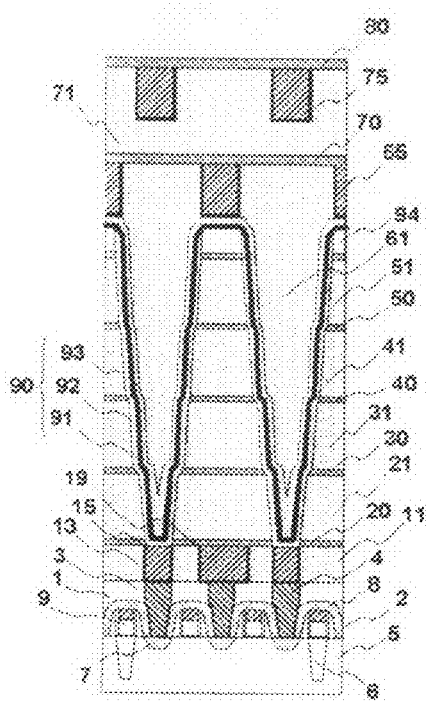
FIGS. 31A and 31B are sectional views showing a semiconductor device in an example of the seventh embodiment of the present invention.
Figure 31B:
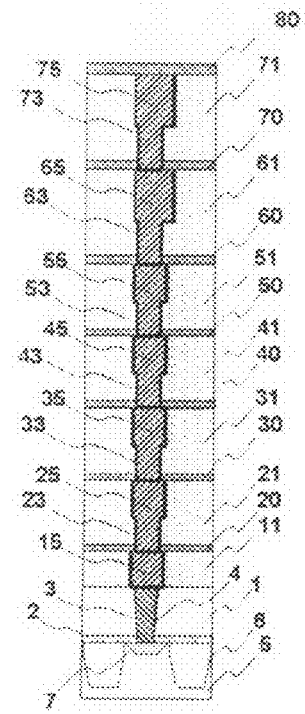

FIGS. 30A to 30C in the seventh embodiment show the structure in which a capacitive element is embedded in a region ranging over three wiring layers of an interlayer insulating layer which separates multi-layered wirings formed in a logic circuit portion by insulation. Similarly, FIGS. 31A and 31B show the structure in which a capacitive element is embedded in a region ranging over four wiring layers. In FIGS. 31A and 31B, a seventh layer wiring 75 and an interlayer insulating layer 71 of the seventh layer are further provided as a seventh wiring layer, in addition to the sixth wiring layer. An opening of the seventh layer wiring can be formed similar to the opening of the second layer wiring. A seventh layer wiring barrier metal layer 73 shown in FIGS. 31A and 31B can be formed similar to the first layer wiring barrier metal layer 13 or the second layer wiring barrier metal layer 23. A cap layer 70 of the seventh layer wiring shown in FIGS. 31A and 31B can be formed similar to the cap layer 30 of the second layer wiring.

In addition to the structure of FIGS. 17A and 17B, a multi-layered wiring of one or two layers is formed in a logic circuit portion. Then, in the same manner as in the fifth embodiment, a cylinder processing resist layer (not shown in the drawings) is formed, and isotropic components are increased by controlling the anisotropy in the dry etching conditions when forming the capacitive element opening A. Thus, the capacitive element opening A is formed in the tapered shape (not shown in the drawings). By executing the same processes as those from FIGS. 23A and 23B after forming the capacitive element opening in the tapered shape, a structure shown in FIGS. 30A to 30C or a structure shown in FIGS. 31A and 31B is formed. By the method used in the seventh embodiment, the lithography process and reticle for forming the capacitive element opening B become unnecessary. As a result, the manufacturing cost can be reduced.

In FIGS. 30A to 30C, the capacitive element 90 is formed to pass through a layer of the second layer wiring 25 to a layer of the fourth layer wiring 45. In FIGS. 31A and 31B, the capacitive element 90 is formed to pass through a layer of the second layer wiring 25 to a layer of the fifth layer wiring 55. In addition, regarding the connection to a lower electrode, the shape in which tapered cylinders with different diameters are connected up and down is adopted in order to directly connect the capacitive element to the first layer wiring 15. This shape is a suitable structure for directly connecting the capacitive element to the first layer wiring for the connection of the capacitive element to the lower electrode, like the third or fourth embodiment.

Moreover, as a modification of the first embodiment, a part of the upper portion of the capacitive element 90 may be formed in an upper multi-layered wiring layer (global wiring), as shown in FIGS. 32A and 32B. In addition, the thickness of each wiring layer or wiring which forms a multi-layered wiring layer located at the upper layer may be larger than that of a multi-layered wiring layer located at the lower layer. In FIGS. 32A and 32B, in the region where the capacitive element 90 is provided, the second to fourth wiring layers have the same thickness such that the thicknesses of the second layer wiring 25 to fourth layer wiring are equal, while the thicknesses of the second to fourth wiring layers are different from that of the fifth wiring layer such that the thicknesses of the second to fourth wirings are different from that of the fifth wiring. Thus, the seventh embodiment may have the structure in which the thickness of each wiring layer is different from the thickness of each wiring in the multi-layered wiring structure of the region where the capacitive element 90 is provided.

Although the interlayer insulating layer and the cap layer are alternately etched by dry etching when forming the opening of the capacitive element 90, an MPS layer is used as the interlayer insulating layer and an SCC layer is used as the cap layer in the seventh embodiment. Accordingly, this is the structure in which the SiOCH layer is laminated. Since the carbon composition of the two layers greatly differs as described above, it becomes easy to control the ratio of etching rates, the so-called etching selectivity of the MPS layer/SCC layer by studying the processing conditions based on dry etching. Accordingly, the opening of the capacitive element 90 can be opened deep by setting the etching selectivity of the SCC layer, which is a cap layer, to be small while etching the MPS layer which is an interlayer insulating layer. On the contrary, etching may be stopped at the bottom of the cylinder opening by setting the etching selectivity of the MPS layer/SCC layer to be large. Particularly in the seventh embodiment, it is necessary to form a deep cylinder opening. In the structure of the seventh embodiment, it is easy to form a deep opening in the laminated structure. This is a technique which is difficult to realize in the combination of the SiOCH interlayer insulating layer and the SiCN cap layer that are commonly used. By using such a structure in which the degree of freedom of processing is high, the satisfactory shape of the opening of the capacitive element 90 can be acquired.

In addition, in the seventh embodiment, since the capacitive element is formed to pass through three or more wiring layers, the cell capacitance of the memory circuit portion can be increased. In this case, the structure of the logic circuit portion is the same multi-layered wiring structure as in the case where there is no memory circuit portion. Accordingly, the design parameters are not changed but are compatible.

Moreover, since the capacitive element 90 is formed to pass through the three or more wiring layers as shown in FIGS. 30A to 30C, the row decode wiring 17 and the column decode wiring 18 are provided in the multi-layered wiring structure in which the capacitive element 90 of the memory circuit region is embedded. Therefore, it becomes unnecessary to use the upper wiring. Accordingly, the number of wiring layers of the memory circuit region can be reduced. In this case, the upper layer of the memory circuit region may be used for wirings of the logic circuit region or for connection between the circuit regions. As a result, the chip area can be reduced.

Eighth Embodiment

FIGS. 34A to 34C are sectional views showing a semiconductor device according to an eighth embodiment of the present invention. FIGS. 34A and 34B at the left and middle sides are sectional views of a memory circuit region, and are sectional views rotated by 90° from each other. In addition, FIG. 34C at the right side shows a typical sectional view of a logic circuit region.

In the semiconductor device according to the eighth embodiment, a lower capacitor wiring connected to a lower electrode (lower electrode layer 91) is a contact plug 4, and the lower electrode (lower electrode layer 91) is directly connected to the contact plug 4. That is, the lower electrode (lower electrode layer 91) is provided over tungsten that forms the contact plug 4.

In FIGS. 34A to 34C, reference numeral 1 denotes an insulating layer between contact layers, reference numeral 2 denotes an etch stop layer, reference numeral 3 denotes a contact barrier metal layer, reference numeral 4 denotes a contact plug, reference numeral 5 denotes a silicon (Si) substrate, reference numeral 6 denotes an element separation shallow trench isolation (STI), reference numeral 7 denotes a diffusion layer, and reference numeral 8 denotes a gate electrode.

In addition, reference numeral 11 denotes an interlayer insulating layer of a first layer, reference numeral 13 denotes a first layer wiring barrier metal layer, reference numeral 15 denotes a first layer wiring, reference numeral 20 denotes a cap layer of a first layer wiring, reference numeral 23 denotes a second layer wiring barrier metal layer, reference numeral 25 denotes a second layer wiring, and reference numeral 30 denotes a cap layer of a second layer wiring. In addition, in the memory circuit portion, the bit line 19 is formed simultaneously with the first layer wiring 15. Here, the bit line 19 is formed in the same layer as the first layer wiring 15, like the third embodiment. In addition, in the eighth embodiment, a wiring layer with only bit lines which is found in Japanese Unexamined Patent Publication NO. 2004-342787 or the like does not exist.

In addition, in the memory circuit portion, the column decode wiring 18 is formed simultaneously with the second layer wiring 25. Although the column decode wiring 18 is formed simultaneously with the second layer wiring 25 in the eighth embodiment, the present invention is not limited thereto. For example, the row decode wiring 17 may be formed instead of the column decode wiring 18. In this case, the column decode wiring 18 which was not formed simultaneously with the second layer wiring 25 may be formed in the sixth layer, for example.

In FIGS. 34A to 34C, the insulating layer 1 between contact layers is a silicon oxide layer, the contact plug 4 is formed of tungsten, and the contact barrier metal layer 3 is a laminated layer of titanium nitride/titanium. In addition, the interlayer insulating layer 11 of the first layer and the interlayer insulating layer 21 of the second layer are low dielectric constant insulating layers and are SiOCH layers, more specifically, MPS layers. The first layer wiring barrier metal layer 13 is a laminated layer of tantalum/tantalum nitride, and the first layer wiring 15 is formed of copper. In addition, the cap layer 20 of the first layer wiring and the cap layer 30 of the second layer wiring are SCC layers. Moreover, for the SCC layer, those disclosed in M. Ueki et al., IEEE IEDM, pp 973-976 (2007) may also be used like the MPS layer. The SCC layer is a kind of SiOCH layer and has resistance to copper diffusion. The method of forming the second layer wiring 25 and the third layer wiring 35 is the same as that in the first embodiment.

Also in the eighth embodiment, an insulating layer with a single layer is used as the interlayer insulating layer and the cap layer. However, a laminated structure of a plurality of kinds of insulating layers may also be used as the interlayer insulating layer and the cap layer, like the first embodiment. For example, a laminated structure of an MPS layer and a SiOCH layer may be used as the interlayer insulating layer, and a laminated structure of a SiC layer and a SiCN layer may be used as the cap layer.

Also in the eighth embodiment, the structure of the capacitive element 90 is formed in the shape in which cylinders with different diameters are connected to each other, like the third embodiment. The eighth embodiment is different from the third embodiment in that the connection with a lower electrode is not performed through the first layer wiring 15 but is performed through the contact plug 4 located at the lower layer. Accordingly, in the eighth embodiment, when forming the first layer wiring 15 in the third embodiment, the first layer wiring is not formed in a region where the lower electrode is to be connected (not shown in the drawings).

The procedures of forming the capacitive element 90 are based on those in the third embodiment. The eighth embodiment is different from the third embodiment in that when forming the capacitive element opening A 88 by dry etching, the cap layer 20 of the first layer wiring layer and the interlayer insulating layer 11 of the first layer are etched such that the contact plug 4 formed of tungsten is exposed. When forming the capacitive element opening A 88, the interlayer insulating layer and the cap layer are alternately etched by dry etching. In this case, in the eighth embodiment, the structure in which the SiOCH layer is laminated is used since an MPS layer is used as the interlayer insulating layer and an SCC layer is used as the cap layer like the third embodiment. Accordingly, the satisfactory shape of the capacitive element opening can be acquired by study on the processing.

The subsequent process is the same as that in the third embodiment. In this case, since the cap layer 20 of the first layer wiring layer and the interlayer insulating layer 11 of the first layer were already etched, it is not necessary to etch back the cap layer 20 of the first layer wiring when forming the capacitive element opening B 89.

Then, the capacitive element 90 and an upper wiring subsequent to the fourth layer wiring 45 are formed like the first embodiment. Thus, the semiconductor integrated circuit is completed.

In the eighth embodiment, a wiring (lower capacitor wiring) which is electrically connected to the lower electrode (lower electrode layer 91) of the capacitive element 90, what is called a wiring which performs lower electrode contact, also serves as the contact plug 4 connected to the diffusion layer 7 of a transistor. Accordingly, the lower electrode is located in the same layer as the first layer wiring 15 of the above-described integrated circuit. For this reason, it becomes easier to ensure the capacitance of the capacitive element 90 than the case where the lower electrode is formed over the first layer wiring 15. In addition, since the lower capacitor wiring also serves as a contact plug connected to a diffusion layer of a transistor, it is not necessary to change the parameter in both the case where the range up to the contact plug 4 is designed as a transistor parameter and the case where the capacitive element 90 is provided together. Simultaneously, since the capacitor contact is formed over tungsten similar to the related art, it is not necessary to consider an influence on the performance by exposure of a different kind of material in the process of forming the capacitive element 90. Specifically, since Cu is not exposed when the lower electrode is formed, it becomes unnecessary to consider the Cu barrier property as the lower electrode. Accordingly, the barrier metal layer having the Cu barrier property, such as TaN, does not need to be used for the lower electrode.

Figure 35A:
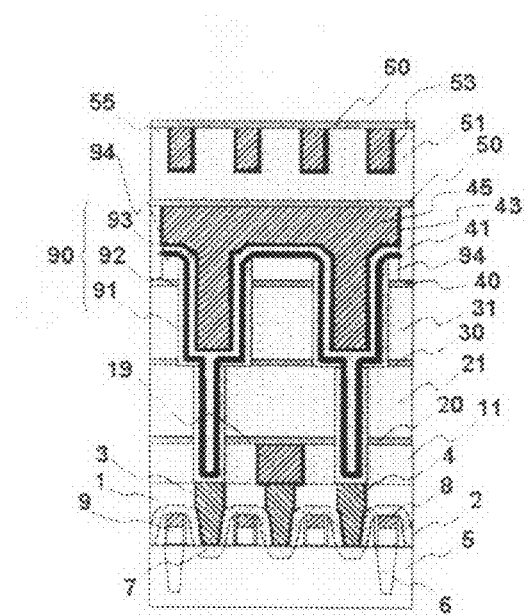
FIGS. 35A and 35B are sectional views showing a semiconductor device in an example of the eighth embodiment of the present invention.
Figure 35B:
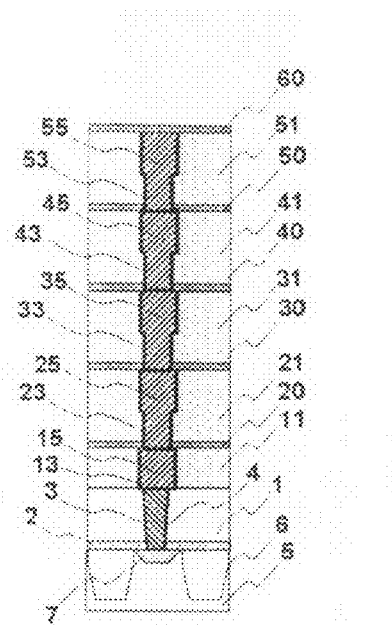

In a modification of the eighth embodiment, as shown in FIGS. 35A and 35B, in the memory circuit region, a plate line wiring (fourth layer wiring 45 formed in the memory circuit region) does not have a wiring shape but completely covers an upper portion of a cylinder capacitor portion so as to become an ultra-wide wiring. In addition, the plate line wiring is embedded as a wiring material to the inside of the cylinder. For example, the wiring shape of the plate line wiring may be the wide wiring shape with slits interposed at predetermined distances.

FIG. 35A on the left side shows a sectional view of a memory circuit region, and FIG. 35B at the right side shows a typical sectional view of a logic circuit region. In FIGS. 35A and 35B, the configuration is almost similar to that shown in FIGS. 34A to 34C. The structure rotated by 90° is not shown but is almost the same as that in FIGS. 34A to 34C.

Also in this modification, the structure of the capacitive element 90 is formed in the shape in which cylinders with different diameters are connected to each other, like the third embodiment. In addition, the structure of the capacitive element 90 is the same as that in the eighth embodiment, and the method of forming the capacitive element 90 is also the same as that in the eighth embodiment. The modification is different from the eighth embodiment in that before forming the fourth layer wiring 45, the process of removing the insulating layer within the cylinder is added (not shown in the drawings). The process after forming the fourth layer wiring of the logic circuit portion is the same as that in the third embodiment.

Ninth Embodiment

Figure 36A:
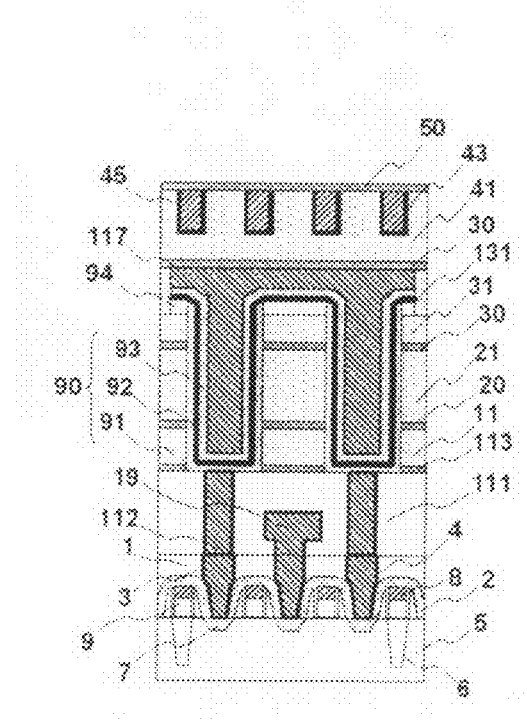
FIGS. 36A and 36B are sectional views showing a semiconductor device in an example of a ninth embodiment of the present invention.
Figure 36B:
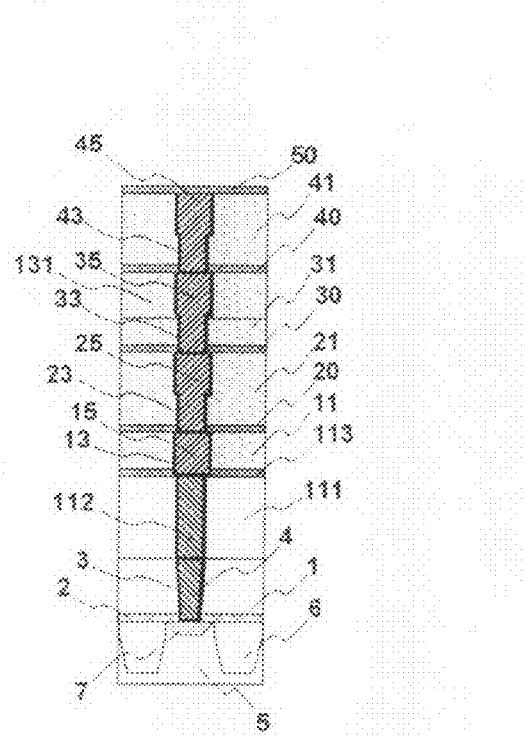

FIGS. 36A and 36B are sectional views showing a semiconductor device according to a ninth embodiment of the present invention. FIG. 36A on the left side shows a sectional view of a memory circuit region, and FIG. 36B at the right side shows a typical sectional view of a logic circuit region. In FIGS. 36A and 36B, the MOS transistor 9 generated by using the typical method of forming an integrated circuit is provided in the same manner as in the first embodiment. Moreover, in the ninth embodiment, a lift-up insulating layer A 111 is formed over a contact correlation insulating layer 1 as shown in FIGS. 33A and 33B as the known technique. In the lift-up insulating layer A 111, a bit line 19 and a lift-up wiring plug A 112 are formed. The method of forming the bit line 19 and the lift-up wiring plug A 112 may be formed by the technique that is generally known. Since the bit line 19 is formed in the lower layer of the first layer wiring 15, the bit line 19 is called a 0-th layer wiring.

For example, a laminated layer of a titanium nitride layer and a tungsten layer serving as a bit line is processed into a bit line pattern by the lithography technique and the etching technique. Then, the lift-up insulating layer A 111 is formed, and a level difference caused by the bit line 19 is made to be flat by the CMP technique. A connection hole for forming the lift-up wiring plug A 112 is formed using the lithography technique and the etching technique again. Then, a laminated layer of a titanium nitride layer and a tungsten layer is formed to be embedded in the connection hole, and the surplus portion is removed by the CMP technique.

The above is one of the formation examples. In this case, a silicon oxide layer is usually used for the lift-up insulating layer A 111. As the lift-up insulating layer A 111, an insulating layer which can stand the process temperature when forming the lift-up wiring plug A 112 is preferable. Moreover, as the method of forming the bit line 19, it is also possible to form the bit line 19 in the forming method described above after forming the lift-up insulating layer A 111 thin first and then opening a connection hole for connection with the contact plug 4 to be connected to the bit line 19.

After forming the bit line 19 and the lift-up wiring plug A 112, the first layer wiring 15 and the second layer wiring 25 shown in FIGS. 36A and 36B are formed by the technique used when forming the third layer wiring and the fourth layer wiring in the first embodiment. In FIGS. 36A and 36B, however, a process of forming a via layer is not necessary because the first layer wiring 15 does not have a via layer.

After forming the second layer wiring 25, the capacitive element 90 is formed by the technique which was also described in the first embodiment. In the ninth embodiment, the interlayer insulating layer 31 of the third layer is formed to have a thickness equal to or less than that corresponding to the via layer after forming the cap layer 30 of the second layer wiring 25, unlike the first embodiment. Then, the hard mask insulating layer 94 is formed. Then, in order to form the capacitive element 90 in the same manner as in the first embodiment, the lower electrode layer 91 is formed and the capacitor insulating layer 92 and the upper electrode layer 93 are formed.

In the ninth embodiment, a metal material that becomes the plate line 117 is formed after forming the upper electrode layer 93, unlike the first embodiment. For example, it is a tungsten layer. The thickness of the metal material layer is set such that the surface height is lower than the height of the surface of a wiring layer of the third layer.

Here, the plate line 117 as a plate line, the upper electrode layer 93, the capacitor insulating layer 92, and the hard mask insulating layer 94 are processed by the same technique used when forming the bit line 19. Then, the interlayer insulating layer B 131 of the third layer is formed. Similar to the first embodiment, in the memory circuit portion, a level difference occurs between the memory circuit portion and the logic circuit portion due to the existence of the capacitive element 90. Accordingly, this is flattened by the technique, such as CMP. The thickness of the interlayer insulating layer B 131 of the third layer after the flattening is set to be the height of the upper surface of the third layer wiring 35.

Then, in the same manner in the first embodiment, a hard mask insulating layer (not shown in the drawings) is formed and the third layer wiring 35 is formed.

In the ninth embodiment, an example where a tungsten layer is used as a plate line is assumed. However, the shape of the plate line wiring shown in FIGS. 14A to 14C in the first embodiment or FIGS. 35A and 35B in the modification of the eighth embodiment may also be applied.

In the example of the ninth embodiment, the wiring structure of the logic circuit portion is so special as to be close to the known structure, compared with the first to eighth embodiments. Accordingly, it is difficult to completely match the design parameter of the logic circuit portion with that of a normal logic LSI in which a memory circuit portion is not provided together with a logic circuit portion. However, it is possible to make the design parameter close to that in the known technique. Similarly, the number of layers of the multi-layered wiring structure can be effectively utilized compared with the known technique. The ninth embodiment is advantageous in that the structure can be easily formed since the structure is relatively close to the known technique. Undoubtedly, the effect obtained by disposing the capacitive element over a plurality of layers of the multi-layered wiring is acquired like the other embodiments.

Tenth Embodiment

Figure 46:
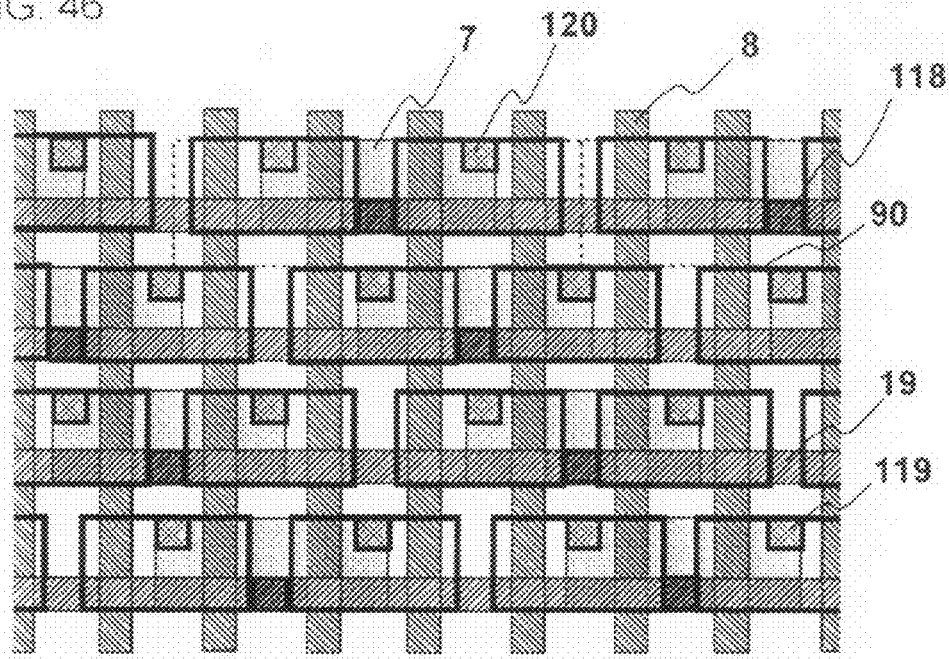
FIG. 46 is a plane view showing layout of a semiconductor device in an example of the tenth embodiment of the present invention.

FIGS. 44 to 46 are plane layout views showing a semiconductor device according to a tenth embodiment of the present invention.

The Figs show a typical device structure in the memory circuit region of the first embodiment. The description of a part of wirings such as particularly plate lines and other wirings will not be repeated in a following description.

The gate electrode 8 to be the word line and the bit line 19 are normal to each other. The bit line 19 is formed in parallel with column (Y) decode line 18 and a linear shape. The cylinder-shaped capacitive element 90 is formed in a rectangular shape. In the tenth embodiment, the column decode wirings are disposed so that a ratio of the bit line 19 to the column decode wiring 18 is 3:1. The disposition ratio of the bit line 19 to the column decode wiring 18 may be 16:1, 64:1, or larger. In the tenth embodiment, by forming the bit line 19 in a linear shape (rectangular shape), it is possible to form the cylinder-shaped capacitive element 90 in a rectangular shape. Therefore, exposure including an optical proximity correction and a forming process such as dry etching process become easy. Particularly in a next generation of the 32 nm and 28 nm technology the optical proximity correction becomes complex. Forming each element pattern in a simple rectangular shape or a linear shape is highly advantageous, in order to increase the bit density per unit area or to obtain the shape as designed.

FIG. 44 is a layout view in the plain layout of the capacitive element 90 in which the margin of a capacitive contact 119 and capacitive cell contact 120 is ensured. On the other hand, FIG. 45 is a layout view in which the margin is cut at the side of the outer periphery of the capacitive element 90. In the layout of FIG. 45, the bit density can be improved as compared with the layout of FIG. 44. In the layout shown in FIG. 45, however, the margin of the capacitive contact 119 and the capacitive cell contact does not exist in some one direction, so that the misalignment generated during formation may increase the resistance.

The layout of the diffusion layer 7 shown in FIG. 46 changed from the layout of FIG. 44. Particularly in the layout of FIG. 46, when turned-back bit line system is employed, the bit density per unit area can be increased.

FIGS. 44 to 46 shows the fifth layer wiring 55 serving as a so-called word line shunt wiring which decreases resistance of the word, and a word line contact 121 which contacts the word line, at the outer periphery of the memory circuit region. FIGS. 44 and 45 are plane view showing a planar structure of the word line contact 121 is shown therein. The word line contact 121 is connected from the fifth layer wiring to the first layer wiring through a stacked-shape via, as like the logic circuit region of the tenth embodiment. In addition, the first layer wiring contacts to the gate electrode 8 through the contact plug 4. The word line contact 121 is formed at the bit lines every certain number of the bit lines, such as every 16 bit lines, 256 bit lines, and 512 bit lines, and formed at the outer periphery of the memory circuit region.

Figure 47:
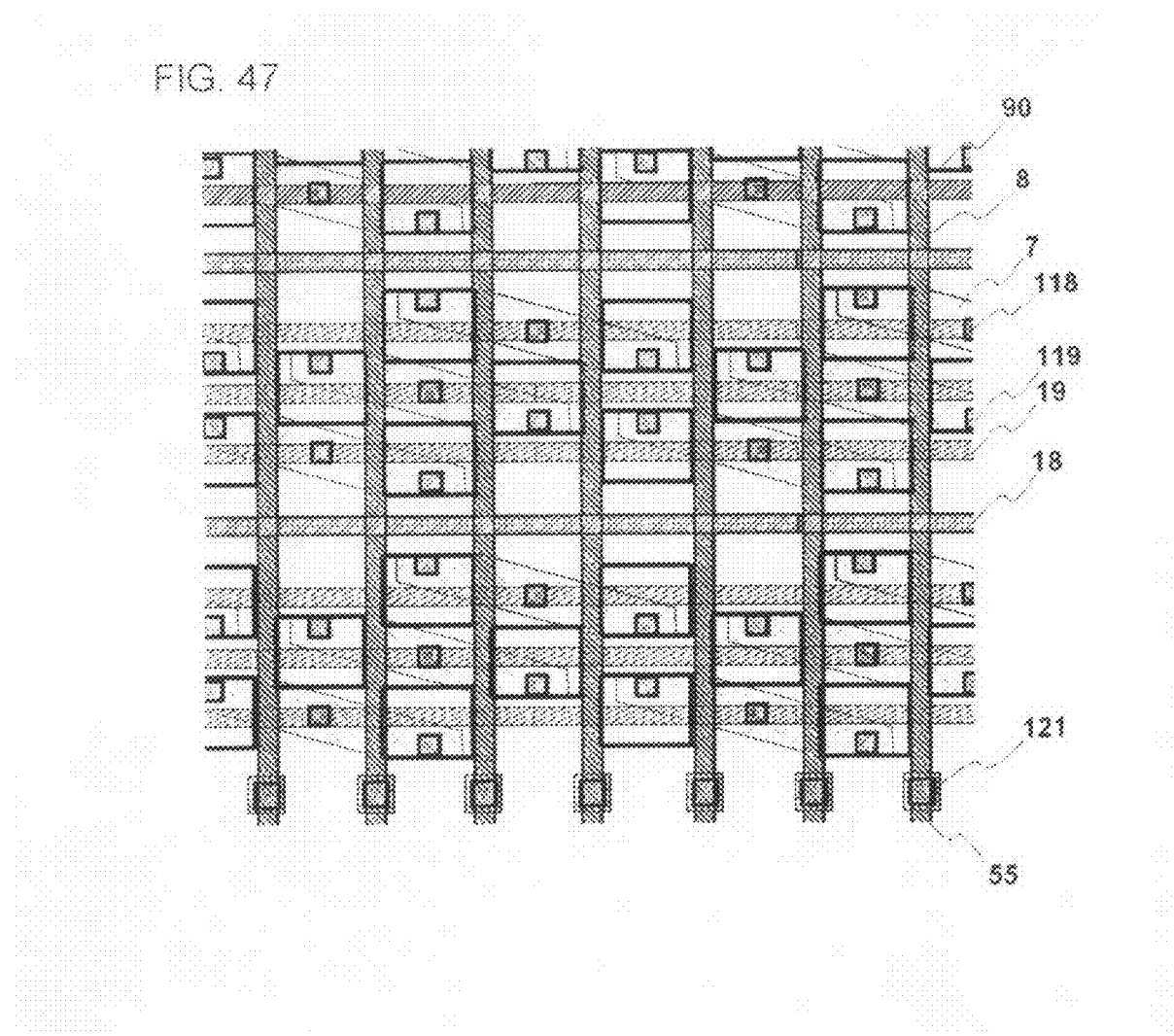
FIG. 47 is a plane view showing layout of a semiconductor device in an example of the tenth embodiment of the present invention.

FIG. 47 shows an example of the plain layout view in which the diffusion layer 7 is inclined relative to the bit line 19, thereby to be formed in a modified hexagonal shape similar to a parallelogram shape in FIGS. 44, 45, and 46. In the tenth embodiment, by forming the diffusion layer 7 in the modified hexagonal shape, the number of the bits per unit area can be increased as compared with the embodiments shown in FIGS. 44, 45, and 46. On the other hand, by mounting thus inclined shape on the layout pattern, the exposure process of diffusion layer 7 may be complex.

Eleventh Embodiment

FIG. 48 is plane layout view showing a semiconductor device according to an eleventh embodiment of the present invention.

The FIG. 48 shows a typical device structure in the memory circuit region of the first embodiment. The description of a part of wirings such as particularly plate lines 117 and other wirings will not be repeated in a following description.

The gate electrode 8 to be the word line and the column (Y) decode wiring 18 are normal to each other. The bit line 19 is formed in parallel with the column (Y) decode wiring 18. A part of the bit line 19 is formed inclined relative to the column (Y) decode wiring 18 so as to bypass the capacitive contact 119 and the bit line contact 118. The inclined portion exits under the fifth layer wiring 55 in FIG. 48, in which the inclined portion is not shown. In the eleventh embodiment, a disposition ratio of the bit line 19 to the column decode wiring 18 is 3:1. The disposition ratio of the bit line 19 to the column decode wiring 18 may be 16:1, 64:1, or larger.

The diffusion layer 7 is inclined relative to the bit line 19, thereby to be formed in a modified hexagonal shape similar to a parallelogram shape. In addition, the cylinder capacitor 90 is formed in a modified hexagonal shape. Therefore, the number of bits per unit area can be increased. FIG. 48 shows the fifth layer wiring 55 serving as a so-called word line shunt wiring which decreases resistance of the word, and a word line contact 121 which contacts the word line, at the outer periphery of the memory circuit region. Since FIG. 48 is a plane view showing a planar structure of the word line contact 121 is shown therein. The word line contact 121 is connected from the fifth layer wiring to the first layer wiring through a stacked-shape via, as like the logic circuit region of the tenth embodiment. In addition, the first layer wiring contacts to the gate electrode 8 through the contact plug 4. The word line contact 121 is formed at the bit lines every certain number of the bit lines, such as every 16 bit lines, 256 bit lines, and 512 bit lines, and formed at the outer periphery of the memory circuit region.

Moreover, it is a matter of course that the above embodiments and the plurality of modifications may be combined within the range in which the contents do not conflict with each other. In addition, although the structure and the like of each portion were specifically described in the above embodiments and modifications, the structure and the like may be variously changed within the range where the invention of this application is satisfied.

It is apparent that the present invention is not limited to the above embodiment, and may be modified and changed without departing from the scope and spirit of the invention.

What is claimed is:

1. A semiconductor device, comprising:
    a semiconductor substrate;
    a multi-layered wiring structure which is formed over said semiconductor substrate and in which a plurality of wiring layers, each of which comprises a wiring and an insulating layer, are laminated; and
    a capacitive element comprising:
        a lower electrode;
        a capacitor insulating layer; and
        an upper electrode, the capacitive element being embedded in said multi-layered wiring structure,
    wherein at least two or more wiring layers of said plurality of wiring layers are provided between a lower capacitor wiring connected to said lower electrode and an upper capacitor wiring connected to said upper electrode, and
    wherein each of said at least two or more wiring layers comprises a via, said via being connected to said wiring formed in each of said at least two or more wiring layers and being connected to another wiring formed in another wiring layer located below each of said at least two or more wiring layers;
    another wiring, said another wiring being provided in a same wiring layer as the lower capacitor wiring,
        wherein the another wiring has a thickness equal to that of the lower capacitor wiring, in a normal direction of the semiconductor substrate, and
        wherein the lower capacitor wiring and the another wiring have a same layer structure;
    a first lower wiring formed under the lower capacitor wiring and a second lower wiring formed under the another wiring; and
    a first barrier metal layer covering a bottom surface of the first lower wiring and a second barrier metal layer covering a bottom surface of the second lower wiring,
        wherein the first lower wiring is connected to the first barrier metal layer and the second lower wiring is connected to the second barrier metal layer.

2. The semiconductor device as set forth in claim 1, wherein at least each wiring of said plurality of wiring layers in a region where said capacitive element is provided comprises a wiring material comprising copper as a main component.

3. The semiconductor device as set forth in claim 1, wherein each wiring of said plurality of wiring layers comprises a wiring material comprising copper as a main component.

4. The semiconductor device as set forth in claim 1, wherein an upper surface of said upper capacitor wiring and an upper surface of a wiring of said wiring layer provided with said upper capacitor wiring are coplanar.

5. The semiconductor device as set forth in claim 1, wherein said upper capacitor wiring is directly connected to said upper electrode.

6. The semiconductor device as set forth in claim 1, wherein a connection via is provided between said upper electrode and said upper capacitor wiring.

7. The semiconductor device as set forth in claim 1, wherein an upper surface of said lower capacitor wiring and an upper surface of a wiring of said wiring layer provided with said lower capacitor wiring are coplanar.

8. The semiconductor device as set forth in claim 1, further comprising a signal wiring configured to form a connection between semiconductor elements,
    wherein said lower capacitor wiring connected to said lower electrode is connected to a contact plug, the contact plug being connected to a diffusion layer formed near a surface of said semiconductor substrate, and
    wherein the signal wiring is formed in a same layer as said lower capacitor wiring.

9. The semiconductor device as set forth in claim 1, further comprising a bit line,
    wherein said bit line and said lower capacitor wiring are provided in a same layer.

10. The semiconductor device as set forth in claim 1, wherein a structure of said capacitive element has a shape in which cylinders with different diameters are connected to each other.

11. The semiconductor device as set forth in claim 1, further comprising a silicon oxide layer that is partially provided at a lower portion of said capacitor insulating layer and provided at other than an opening of said capacitive element,
    wherein said insulating layer of each said wiring layer of the plurality of wiring layers comprises:
        a laminated structure comprising:
            a low dielectric constant SiOCH layer comprising silicon (Si), oxygen (O), and carbon (C); and
            a cap insulating layer provided over said wiring.

12. The semiconductor device as set forth in claim 1, wherein at least in a region where said capacitive element is provided, each of said plurality of wiring layers has a same height and each wiring of the plurality of wiring layers has a same height.

13. The semiconductor device as set forth in claim 1, further comprising a field effect transistor, the field effect transistor comprising:
    a first diffusion layer formed on a surface of said semiconductor substrate;
    a second diffusion layer formed on said surface of said semiconductor substrate;
    a gate dielectric layer provided over said substrate between said first and second diffusion layers; and
    a gate electrode provided over said gate dielectric layer.

14. The semiconductor device as set forth in claim 13, wherein said gate dielectric layer comprises a high dielectric constant gate dielectric layer.

15. The semiconductor device as set forth in claim 13, wherein said gate electrode comprises a metal gate electrode.

16. The semiconductor device as set forth in claim 13, wherein said field effect transistor comprises one of an N type and a P type field effect transistor.

17. The semiconductor device as set forth in claim 13, wherein one of said first and second diffusion layers comprises a source diffused layer, and an other one of the first and second diffusion layers comprises a drain diffusion layer.

18. The semiconductor device as set forth in claim 1, wherein the lower capacitor wiring comprises a wiring material comprising copper as a main component.

19. A semiconductor device, comprising:
    a semiconductor substrate;
    a multi-layered wiring structure which is formed over said semiconductor substrate and in which a plurality of wiring layers, each of which comprises a wiring and an insulating layer, are laminated; and
    a capacitive element comprising:
        a lower electrode;
        a capacitor insulating layer; and
        an upper electrode, the capacitive element being embedded in said multi-layered wiring structure,
    wherein at least two or more wiring layers of said plurality of wiring layers are provided between a lower capacitor wiring connected to said lower electrode and an upper capacitor wiring connected to said upper electrode, wherein a proportion of a constant carbon/silicon (C/Si) ratio of a cap insulating layer of the plurality of wiring layers comprises a cap insulating layer (C/Si) and a proportion of a constant (C/Si) ratio of a low dielectric constant SiOCH layer of the plurality of wiring layers comprises a low dielectric constant SiOCH layer (C/Si), and wherein a ratio of said cap insulating layer (C/Si) to said low dielectric constant SiOCH layer (C/Si) is less than 2.

20. A semiconductor device, comprising:
a semiconductor substrate;
a multi-layered wiring structure which is formed over said semiconductor substrate and in which a plurality of wiring layers, each of which comprises a wiring and an insulating layer, are laminated;
a capacitive element comprising:
  a lower electrode;
  a capacitor insulating layer; and
  an upper electrode, the capacitive element being embedded in said multi-layered wiring structure,
    wherein at least two or more wiring layers of said plurality of wiring layers are provided between a lower capacitor wiring connected to said lower electrode and an upper capacitor wiring connected to said upper electrode;
another wiring, said another wiring being provided in a same wiring layer as the lower capacitor wiring,
  wherein the another wiring has a thickness equal to that of the lower capacitor wiring, in a normal direction of the semiconductor substrate, and
  wherein the lower capacitor wiring and the another wiring have a same layer structure;
a first lower wiring formed under the lower capacitor wiring and a second lower wiring formed under the another wiring; and
a first barrier metal layer covering a bottom surface of the first lower wiring and a second barrier metal layer covering a bottom surface of the second lower wiring,
wherein the first lower wiring is connected to the first barrier metal layer and the second lower wiring is connected to the second barrier metal layer.

21. A semiconductor device, comprising:
a semiconductor substrate;
a multi-layered wiring structure comprising a plurality of wiring layers;
a capacitive element that is embedded in the multi-layered wiring structure,
  wherein the multi-layered wiring structure is disposed over the semiconductor substrate, and the plurality of wiring layers are laminated,
  wherein the plurality of wiring layers each comprise a wiring and an insulating layer,
  wherein at least two or more wiring layers of the plurality of wiring layers are provided between a lower capacitor wiring connected to a first electrode of the capacitive element and an upper capacitor wiring connected to a second electrode of the capacitive element, and
  wherein each of the at least two or more wiring layers comprises a via, the via being connected to the wiring formed in each of the at least two or more wiring layers and being connected to another wiring formed in another wiring layer located below each of the at least two or more wiring layers;
another wiring, the another wiring being provided in a same wiring layer as the lower capacitor wiring,
  wherein the another wiring has a thickness equal to that of the lower capacitor wiring, in a normal direction of the semiconductor substrate, and
  wherein the lower capacitor wiring and the another wiring have a same layer structure;
a first lower wiring formed under the lower capacitor wiring and a second lower wiring formed under the another wiring; and
a first barrier metal layer covering a bottom surface of the first lower wiring and a second barrier metal layer covering a bottom surface of the second lower wiring,
wherein the first lower wiring is connected to the first barrier metal layer and the second lower wiring is connected to the second barrier metal layer.

22. The semiconductor device as set forth in claim 21, wherein, in a cross sectional view, the capacitive element bisects the at least two or more wiring layers of the plurality of wiring layers that are provided between the lower capacitor wiring and the upper capacitor wiring.

23. The semiconductor device as set forth in claim 21, wherein the lower capacitor wiring comprises a wiring material comprising copper as a main component.

24. A semiconductor device, comprising:
a semiconductor substrate;
a multi-layered wiring structure comprising a plurality of wiring layers;
a capacitive element that is embedded in the multi-layered wiring structure,
  wherein the multi-layered wiring structure is disposed over the semiconductor substrate, and the plurality of wiring layers are laminated,
  wherein the plurality of wiring layers each comprise a wiring and an insulating layer, and
  wherein at least two or more wiring layers of the plurality of wiring layers are provided between a lower capacitor wiring connected to a first electrode of the capacitive element and an upper capacitor wiring connected to a second electrode of the capacitive element;
another wiring, the another wiring being provided in a same wiring layer as the lower capacitor wiring,
  wherein the another wiring has a thickness equal to that of the lower capacitor wiring, in a normal direction of the semiconductor substrate, and
  wherein the lower capacitor wiring and the another wiring have a same layer structure;
a first lower wiring formed under the lower capacitor wiring and a second lower wiring formed under the another wiring; and
a first barrier metal layer covering a bottom surface of the first lower wiring and a second barrier metal layer covering a bottom surface of the second lower wiring,
wherein the first lower wiring is connected to the first barrier metal layer and the second lower wiring is connected to the second barrier metal layer.

* * * * *